(12) United States Patent
Iizuka et al.

(10) Patent No.: US 9,344,034 B2
(45) Date of Patent: *May 17, 2016

(54) OSCILLATOR AND SEMICONDUCTOR INTEGRATED CIRCUIT DEVICE

(71) Applicant: Renesas Electronics Corporation, Kawasaki-shi, Kanagawa (JP)

(72) Inventors: Yoichi Iizuka, Kanagawa (JP); Yasuo Ikeda, Kanagawa (JP); Satoshi Onishi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/218,580

(22) Filed: Mar. 18, 2014

(65) Prior Publication Data

US 2014/0203882 A1    Jul. 24, 2014

Related U.S. Application Data

(63) Continuation of application No. 13/364,903, filed on Feb. 2, 2012, now Pat. No. 8,717,113.

(30) Foreign Application Priority Data

Feb. 9, 2011   (JP) ................. 2011-025908

(51) Int. Cl.
*H03L 1/00* (2006.01)
*H03B 5/12* (2006.01)
(Continued)

(52) U.S. Cl.
CPC ............... *H03B 5/1212* (2013.01); *H03B 1/00* (2013.01); *H03B 5/1228* (2013.01); *H03B 5/1253* (2013.01); *H03L 1/026* (2013.01)

(58) Field of Classification Search
CPC ...... H03B 1/00; H03B 5/1228; H03B 5/1212; H03B 5/1253; H03L 1/026
USPC ............. 331/117 R, 117 FE, 167, 177 V, 176
See application file for complete search history.

(56) References Cited

U.S. PATENT DOCUMENTS 7,132,874 B2   11/2006   McCorquodale et al.
7,307,486 B2 * 12/2007   Pernia et al. ................... 331/173
(Continued)

FOREIGN PATENT DOCUMENTS

JP   10-004322 A   6/1998
JP   10-233485 A   9/1998
(Continued)

*Primary Examiner* — Arnold Kinkead
(74) *Attorney, Agent, or Firm* — Foley & Lardner LLP

(57) ABSTRACT

An oscillator and a semiconductor integrated circuit device with an internal oscillator capable of compensating the temperature characteristics even when there is a large parasitic capacitance too large to ignore directly between the output terminals of the oscillator. In an oscillator containing an inductance element L, and a capacitive element C, and an amplifier each coupled in parallel across a first and second terminal, the amplifier amplifies the resonance generated by the inductance element and capacitive element and issues an output from the first terminal and the second terminal, and in which a first resistance element with a larger resistance value than the parasitic resistance of the inductance element between the first terminal and the second terminal, is coupled in serial with the capacitive element between the first terminal and the second terminal.

8 Claims, 17 Drawing Sheets

(51) Int. Cl.
*H03B 1/00* (2006.01)
*H03L 1/02* (2006.01)

(56) References Cited

U.S. PATENT DOCUMENTS

| | | | |
|---|---|---|---|
| 7,511,589 B2 * | 3/2009 | Tarng | 331/117 R |
| 7,656,243 B2 | 2/2010 | McCorquodale et al. | |
| 8,717,113 B2 * | 5/2014 | Iizuka et al. | 331/167 |
| 2006/0017519 A1 | 1/2006 | Pernia et al. | |
| 2006/0217102 A1 | 9/2006 | Degani et al. | |
| 2008/0048794 A1 | 2/2008 | McCorquodale et al. | |
| 2008/0303603 A1 | 12/2008 | Kousai et al. | |
| 2010/0045394 A1 | 2/2010 | Hanifi et al. | |
| 2011/0298547 A1 | 12/2011 | Hanafi et al. | |

FOREIGN PATENT DOCUMENTS

| | | |
|---|---|---|
| JP | 2006-270959 A | 10/2006 |
| JP | 2007-531404 A | 11/2007 |
| JP | 2008-306331 A | 12/2008 |
| JP | 2010-050973 A | 3/2010 |

\* cited by examiner

PRIOR ART

OSCILLATOR AND SEMICONDUCTOR INTEGRATED CIRCUIT DEVICE

CROSS-REFERENCE TO RELATED PATENT APPLICATIONS

Japan Priority Application 2011-025908, filed Feb. 9, 2011 including the specification, drawings, claim and abstract, is incorporated herein by reference in its entirely. This application is a Continuation of U.S. application Ser. No. 13/364,903, filed Feb. 2, 2012, incorporated herein by reference in its entirety.

BACKGROUND OF THE INVENTION

The present invention relates to an oscillator and semiconductor integrated circuit device, and relates in particular to an oscillator within a semiconductor integrated circuit including an inductance element and capacitance element for compensating the temperature characteristics, and a semiconductor integrated circuit device containing an internal oscillator, and utilizing the output signal of that oscillator as a reference clock.

Semiconductor integrated circuits in the related art requiring a relatively accurate clock pulse typically used a piezoelectric oscillator such as crystal oscillator coupled to the external terminals of the semiconductor integrated circuit. An internal amplifier circuit within the semiconductor integrated circuit was made to oscillate, to generate the clock pulse required for semiconductor integrated circuit operation. However, to make the mounting substrate within the semiconductor integrated circuit smaller and at a lower cost, the LC oscillator is being made an internal component within the semiconductor integrated circuit. Forming the inductance element L and the capacitance element C over the semiconductor substrate in the semiconductor integrated circuit eliminates the need for externally attaching a crystal oscillator to an external portion of the semiconductor integrated circuit so that the intrinsic value of the semiconductor integrated circuit is enhanced and the mounted substrate can be achieved at a low cost and a miniaturized shape. The ideal oscillation frequency of the LC oscillator is known to be $1/(2\pi\sqrt{(LC)})$. When adjusting the oscillator circuit frequency becomes necessary, the frequency can be adjusted by correcting the error in the oscillation frequency by adjusting the L (inductance) or C (capacitance).

Making this type of LC oscillator an internal component within the semiconductor integrated circuit requires that the LC oscillator provide stable oscillation at the specified frequency in semiconductor integrated circuits having variations or irregularities in the manufacturing process, supply voltage, and operating temperature, etc.

Among the above irregularities, the effects of those irregularities stemming from the manufacturing process can be suppressed by methods such as measuring the process variations by screening and other techniques after chip selection. Moreover, irregularities stemming from the supply voltage can be compensated by forming a fixed voltage supply such as a band-gap reference within the semiconductor integrated circuit. Suppressing effects from irregularities stemming from the manufacturing process and irregularities stemming from the supply voltage is comparatively easy to accomplish. However, compensating for irregularities due to the operating temperature to achieve a specified (fixed) oscillation frequency is not easily accomplished. Examples of the related art as countermeasure solutions for operating temperature irregularities in these types of semiconductor integrated circuits having internal LC oscillators are disclosed in Japanese Unexamined Patent Publication No. 2010-50973 and Japanese Unexamined Patent Application Publication (Translation of PCT Application) No. 2007-531404. The temperature compensation in these type of internal oscillators implemented by the method disclosed in Japanese Unexamined Patent Application Publication (Translation of PCT Application) No. 2007-531404 is complicated and tends to require a larger circuit scale.

The method in Japanese Unexamined Patent Publication No. 2010-50973 on the other hand discloses a comparatively simple method for compensating the temperature characteristics. FIG. 16 is a circuit diagram showing a (temperature compensated) LC oscillator tank operating at the temperature null phase as described in Japanese Unexamined Patent Publication No. 2010-50973. The LC oscillator tank in Japanese Unexamined Patent Publication No. 2010-50973 shown in FIG. 16 amplifies the resonance occurring in the inductance element L and capacitance element C using an amplifier circuit not shown in the drawing and causes oscillation. Generally making the wiring of inductance element L longer is unavoidable to achieve an inductance element L in the semiconductor integrated circuit so that the parasitic resistance rL value of the inductance element L becomes a somewhat large value. The parasitic resistance rL for the inductance element L can be considered an equivalent circuit where the inductor L and resistor rL are coupled in series as shown FIG. 16. In contrast to the resistance value of this parasitic resistance rL, the value of the parasitic resistance rC coupled in series with the capacitor C formed in the semiconductor integrated circuit is not as large as the rL (resistor) value. Moreover, using a parasitic resistance rC having a large value is traditionally considered a drawback in view of greater noise jitter.

In regards to this issue, the description in paragraph 0039 of Japanese Unexamined Patent Publication No. 2010-50973 discloses that a non-temperature dependent oscillation frequency can be achieved by coupling the resistor rC for attaining rC=rL, in series to the condenser C. The resistance rC in Japanese Unexamined Patent Publication No. 2010-50973 is in other words, not simply a parasitic resistance but a resistance rC attained by coupling a condenser in serial to a resistance rC achieving rC=rL, in order to obtain a non-temperature dependent oscillator Japanese Unexamined Patent Application Publication (Translation of PCT Application) No. 2007-531404 discloses a monolithic clock generator including a temperature compensator to correct the resonant frequency according to the temperature. FIG. 4 of Japanese Unexamined Patent Application Publication (Translation of PCT Application) No. 2007-531404 discloses a resistor Rc (450) coupled in series to a capacitance element Cf (440). However, paragraph 0034 in Japanese Unexamined Patent Application Publication (Translation of PCT Application) No. 2007-531404 states that, "one must understand that though shown separately, the corresponding resistance (or impedance) $R_L$445 and Rc450, are respectively unique to the inductor 435 and capacitor 440; and are one part of the manufacturing process; therefore these are not additions made to the inductor 435 and capacitor 440 and moreover are not components separate from this inductor and capacitor," in the description. So the resistance Rc (450) is at most only a parasitic resistance, and different from the resistance rC in which rC=rL of Japanese Unexamined Patent Publication No. 2010-50973 and that is continually rendered as needed.

SUMMARY OF THE INVENTION

The following analysis was derived for the purpose of this invention. The macro-fabrication processing in semiconductor manufacturing technology tends to cause an increase in the parasitic capacitance due to inter-wiring capacitance. Moreover, as the system operates at higher speeds, the oscillator within the semiconductor integrated circuit must also be made to self-oscillate at a high frequency. Oscillating at a high frequency requires reducing the capacitance C value in order to obtain the LC time constant. As already described in Japanese Unexamined Patent Publication No. 2010-50973, even if the resistance rC value serially coupled to capacitance C is made equivalent to the parasitic resistance rL value serially connected to the inductor L; besides the capacitance C, there is also a parasitic capacitance Cpara that is directly parasitic across the oscillator terminals and that does not pass through a serial resistance rC such as the wiring capacitance. Due to the presence of this parasitic capacitance Cpara, attaining an oscillator capable of compensating for temperature characteristics is impossible even for example it rC equals rL.

According to one aspect of the present invention, there is provided an oscillator including an inductance element, a capacitance element, and an amplifier that are respectively coupled in parallel across the first terminal and the second terminal, and that utilizes the amplifier to amplify the resonance generated by the inductance element and the capacitance element, and send the output from the first terminal and the second terminal; and in which a first resistance element with a larger resistance than the parasitic resistance of the inductance element between the first terminal and the second terminal, is coupled in series with a capacitance element between the first terminal and the second terminal.

According to another aspect of the present invention, there is provided a semiconductor integrated circuit including a semiconductor substrate, and an oscillator according to the above described first aspect that is made over the semiconductor substrate; and a synchronizing circuit formed over the semiconductor substrate, and with a clock signal input terminal coupled to the first terminal and the second terminal of the oscillator, to operate while receiving the oscillation clock from the oscillator.

The first aspect of the present invention therefore attains an oscillator that compensates for temperature characteristics even in cases where the size of the parasitic capacitance serially coupled between the first terminal and the second terminal without passing through the first resistance element is too large to ignore.

The second aspect of the present invention attains a semiconductor integrated circuit device containing an internal oscillator having minimal temperature variations and that oscillates at a stable oscillation frequency spanning a wide temperature range. Moreover, a highly accurate clock can be provided for the internal synchronizing circuit.

DETAILED DESCRIPTION OF THE PREFERRED EMBODIMENTS

Figure 1:
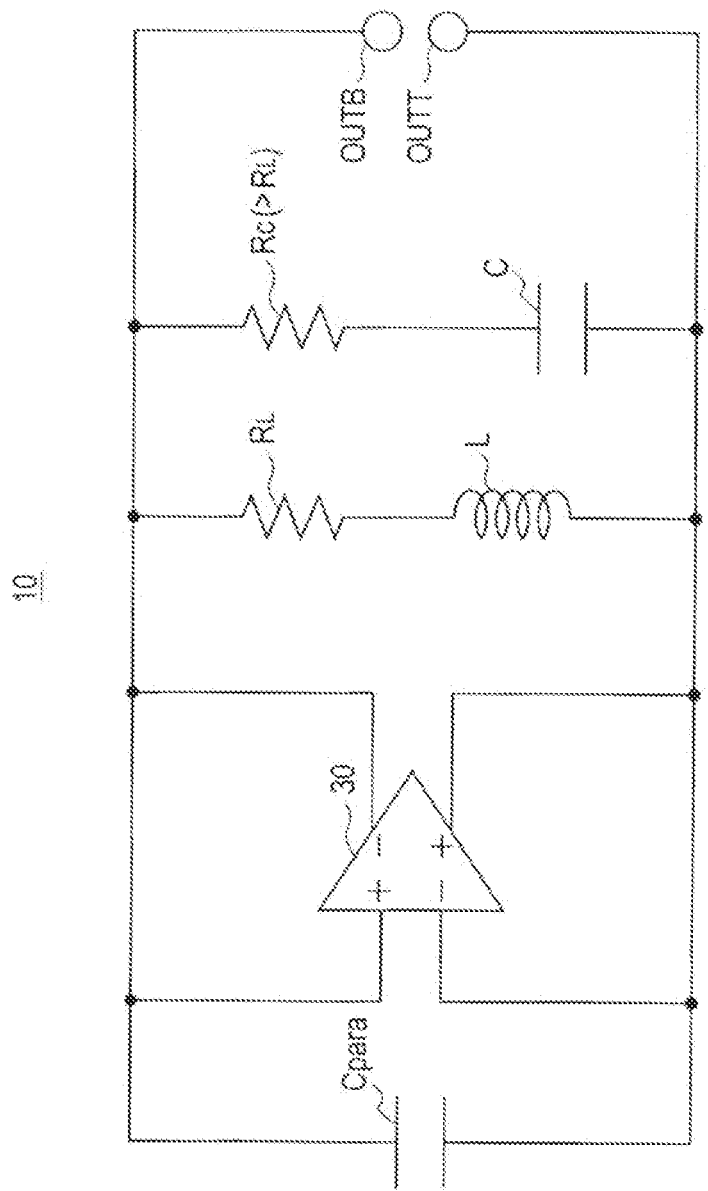
FIG. 1 is a circuit diagram of an equivalent circuit of the oscillator of a first embodiment of the present invention.

Before commencing a detailed description of the specific embodiments, an overview of the embodiments of the present invention is described. The reference numerals of the drawing assigned to the description of the overview are examples for the sole purpose of assisting in gaining an understanding, and are not intended to limit the invention to the state shown in the drawings.

In the oscillator of the present invention as shown in the example in FIG. 1 an inductance element L, a capacitance element C, and an amplifier 30 are each coupled in parallel across the respective first terminal and second terminal (OUTT and OUTB). The amplifier 30 amplifies the resonance occurring due to the inductor element L and the capacitance element C and sends the output from the first terminal and the second terminal (OUTT and OUTB). A first resistance Rc is moreover coupled in series to the capacitance element C between the first terminal and the second terminal. Moreover, in view of the parasitic resistance of the parasitic resistance $R_L$ incidental to the inductance element L, an inductance element L and a parasitic resistance $R_L$ are coupled in series between the first terminal and second terminal as an equivalent circuit.

In Japanese Unexamined Patent Publication No. 2010-50973, a resistance equivalent to the resistance value of this parasitic resistance $R_L$ coupled in series to the capacitance element C is provided to suppress fluctuations in the oscillation frequency of the oscillator occurring due to the temperature characteristics of this parasitic resistance $R_L$.

However, according to results of an evaluation for the present invention, there is a direct parasitic capacitance Cpara that cannot be suppressed by installing a serial resistance Rc such as for suppressing the parasitic capacitance within the wiring and amplifier 30 between the output terminals OUTT and OUTB of the oscillator. Making the oscillator oscillate at a high frequency from several GHz to more than 10 GHz in particular will lower the time constant of the inductance element L and the capacitance element C. This parasitic capacitance Cpara will in particular in that case attain a value that is too large to ignore and compensating the temperature characteristics will be impossible even if a resistance equivalent to the resistance value of the parasitic resistance $R_L$ is serially coupled to the capacitance element C.

Results in the evaluation of the present invention revealed that when there is a parasitic capacitance Cpara that is too large to ignore, then the resistance value of the first resistor Rc coupled in series to the capacitance element C can be made larger than the resistance value of the parasitic resistance $R_L$.

According to results from the evaluation of the present invention, the first resistance element Rc and the inductive element L are preferably elements having essentially the same temperature coefficient. If the first resistance element Rc and the parasitic resistance $R_L$ of the inductance element are made the same temperature coefficient, then for example even if there is a parasitic capacitance Cpara between the first terminal and the second terminal (OUTT and OUTB) where a first resistance element Rc cannot be interposed, then making the resistance value of the first resistance element Rc larger than the resistance value of the parasitic resistance $R_L$ induced by the inductance element L will allow the first resistance element Rc to compensate relatively easily for variations in the oscillation frequency of the oscillator that were caused by temperature dependence of parasitic resistance $R_L$ due to the inductance element L.

The first resistance element Rc and the inductance element L are preferably made from essentially the same metal. Metal with a low electrical resistance such as metals used in the wiring (layers) of semiconductor integrated circuits is preferably utilized in order to make the parasitic resistance of the inductance element L as small a value as possible. Utilizing a metal for the first resistance element that is the same as this inductance element allows easily attaining the same temperature coefficient in the inductance element and the first resistance element; and the first resistance can compensate for temperature characteristics caused by the parasitic resistance of the inductance element.

Due to the presence of the parasitic capacitance Cpara, the resistance value of the first resistance element Rc is preferably set to a resistance value capable of compensating for the temperature characteristics of the oscillator that are dependent on the parasitic resistance $R_L$ induced by the inductance element L. More specifically, the resistance value of the first resistance element Rc can be act by simulation or by actual measurement, to a resistance value that lowers the oscillation frequency temperature dependence to as small a value as possible.

Evaluation results from the present invention also revealed that the first resistance element Rc is preferably a resistance value that essentially satisfies the following formula (1).

$$\omega^4 \times (Rc^2 \times L^2 \times C^2 * Cpara) + \omega^2 \times (L^2 \times (C+Cpara) + Rc^2 \times C^2 \times (R_L^2 \times Cpara - L)) + R_L^2 \times (C+Cpara) - L = 0 \quad \text{formula (1)}$$

Here, L denotes the inductance value of the inductance element C is the capacitance value of the capacitance element, $R_L$ is the resistance value of the parasitic resistance, Cpara is the capacitance value of the parasitic capacitance, and ω is the angular frequency of the oscillator. An angular frequency ω, when a oscillation frequency of the oscillator is at f0, indicates ω=2πf0.

The capacitance value C of the capacitor element and the resistance value Rc of the first resistance element Rc are also preferably set to effectively satisfy the following formula (2) and formula (3) when there is a second parasitic resistance Rcpara that is serially parasitic on the parasitic capacitance Cpara which is parasitic on the output terminals OUTT, OUTB of the oscillator.

$$C \times Rc = Cpara \times Rcpara \quad \text{formula (2)}$$

$$Rc \times Rcpara = R_L \times (Rc + Rcpara) \quad \text{formula (3)}$$

Here, Cpara is the capacitance value of the parasitic capacitance, Rcpara is the resistance value of the second parasitic resistance, and $R_L$ is the resistance value of the parasitic resistance of the inductance element.

The description for the overview is now complete and the specific embodiments are described next in detail while referring to the accompanying drawings.

First Embodiment

FIG. 1 is a diagram of an equivalent circuit of the oscillator 10 of the present embodiment. All of the elements of the oscillator 10 in FIG. 1 can be formed over the semiconductor substrate of the semiconductor integrated circuit. An inductance element L, a capacitance element C and an amplifier 30 are coupled between the inverting output terminal OUTB and the non-inverting output terminal OUTT of the oscillator 10. Moreover, the inductance element L possesses a parasitic resistance and so the inductance element L and parasitic resistance $R_L$ coupled in series between the inverting output terminal OUTB and the non-inverting output terminal OUTT can be viewed as a circuit equivalent to that parasitic resistance $R_L$.

The parasitic capacitance Cpara is a parasitic capacitance that is directly parasitic between the inverting output terminal OUTB and the non-inverting output terminal OUTT of the oscillator 10. This parasitic capacitance Cpara includes the parasitic capacitance of the wiring, and the parasitic capacitance within the amplifier 30. This parasitic capacitance Cpara is directly parasitic between the inverting output terminal OUTB and the non-inverting output terminal OUTT and so a resistance cannot be in series with the parasitic capacitance Cpara between the inverting output terminal OUTB and the non-inverting output terminal OUTT.

The resistance value of the first resistance element Rc is larger than the resistance value of the parasitic resistance $R_L$. The reason the resistance value of the first resistance element Rc is larger than the resistance value of the parasitic resistance $R_L$ is to obtain a fixed (specified) oscillation frequency with as little temperature dependence as possible in the frequency range where actually used by compensating (offsetting) the temperature dependence on the resistance value of resistance element Rc and temperature dependence on the resistance value of parasitic resistance $R_L$, required due to the presence of the parasitic capacitance Cpara. The first resistance element Rc and the inductance element L are formed over the semiconductor substrate using the same metallic wiring layer. Utilizing the same metallic wiring layer makes the resistance temperature coefficients between the first resistance element Rc and the parasitic resistance $R_L$ of the inductance element equal, and makes compensating the temperature characteristics of the first resistance element Rc and the parasitic resistance $R_L$ of the inductance element relatively easy.

The differential input terminal and differential output terminal in the oscillator 30 are coupled to both the inverting output terminal OUTB and the non-inverting output terminal OUTT. The amplifier 30 is also an inverting amplifier that inverts the difference in voltage potential between the inverting output terminal OUTB and the non-inverting output terminal OUTT, and outputs it to the inverting output terminal OUTB and the non-inverting output terminal OUTT. If the amplifier 30 can function as an inverting amplifier to invert the difference in voltage potential between inverting output terminal OUTB and the non-inverting output terminal OUTT, and output it to the inverting output terminal OUTB and the non-inverting output terminal OUTT, then the amplifier may function as a pseudo-differential amplifier.

Figure 2:
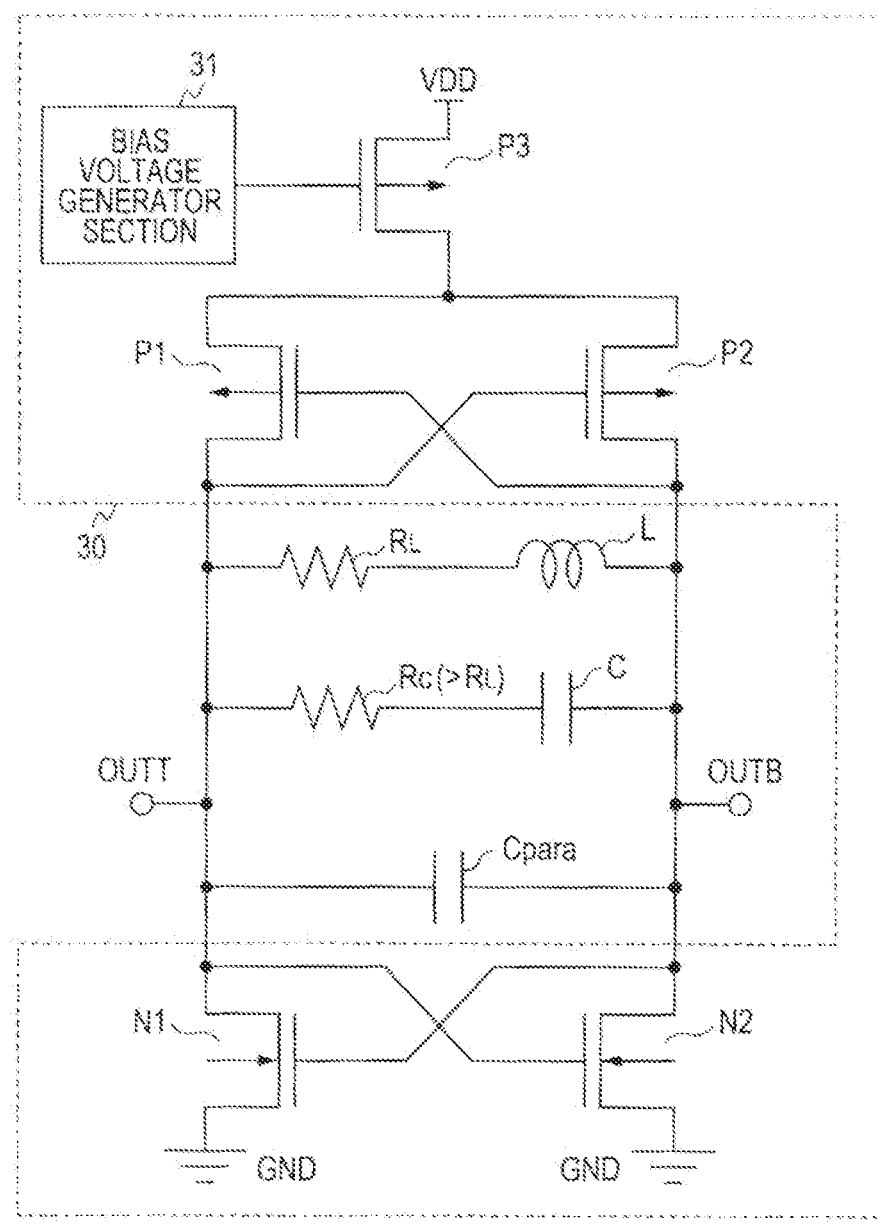
FIG. 2 is a circuit block diagram showing one example of the circuit structure of the oscillator in the first embodiment.

FIG. 2 is a circuit block diagram of the oscillator 10 utilizing an inverter type amplifier that can function as a pseudo-differential amplifier usable for the amplifier 30. Other than the circuit structure within the amplifier 30 shown by the dashed lines, the circuit structure is the same as the structure in FIG. 1. Therefore, other than the circuit structure within the amplifier 30 among those shown in FIG. 2, those descriptions that are the same as for FIG. 1 are avoided and omitted.

In the oscillator 10 in FIG. 2, the amplifier 30 is comprised of a PMOS transistor P3 serving as the current source, and a bias voltage generator unit 31 that applies a bias voltage to the gate of the PMOS transistor P3, and a first inverter containing the PMOS transistor P1 and the NMOS transistor N1, and a second inverter containing the PMOS transistor P2 and the NMOS transistor N2.

The PMOS transistor P3 supplies power to the first inverter including the PMOS transistor P1 and the NMOS transistor N1; and to the second inverter including the PMOS transistor P2 and the NMOS transistor N2. The electrical current value that flows to the PMOS transistor P3 is regulated by the voltage output by the bias voltage generator 31. The input terminal of the first inverter comprised of the PMOS transistor P1 and the NMOS transistor N1 is coupled to the inverter output terminal OUTB; and the output terminal is coupled to the non-inverting output terminal OUTT. The input terminal of the second inverter comprised of the PMOS transistor P2 and the NMOS transistor N2 is also coupled to the non-inverting output terminal OUTT; and the output terminal is coupled to the inverting output terminal OUTB.

The power supply VDD further supplies power by way of the PMOS transistor P3 that functions as the electrical current source, to the power supply for the PMOS transistors P1, P2 of the first inverter and the second inverter. The power supply for the NMOS transistors N1, N2 is serially coupled to ground GND.

In the first embodiment, an optimal value for the first resistor Rc can be found by simulation. Moreover, a prototype model of a semiconductor integrated circuit configured with the oscillator 10 can be experimentally manufactured, the oscillator of that prototype can be evaluated, and optimal values for the first resistance Rc can be set based on those evaluation results.

Evaluation results from the present inventors also revealed that the ideal resistance value for the first resistance Rc as shown in a formula is preferably a resistance value that satisfies the following formula (1).

$$\omega^4 \times (Rc^2 \times L^2 \times C^2 * Cpara) + \omega^2 \times (L^2 \times (C+Cpara) + Rc^2 \times C^2 \times (R_L^2 \times Cpara - L)) + R_L^2 \times (C+Cpara) - L = 0 \qquad \text{formula (1)}$$

In formula (1), the L denotes the inductance of the inductance element, C is the capacitance of the capacitance element, R.sub.L is resistance value of the parasitic resistance of inductance element, Cpara is the capacitance value of the parasitic capacitance, and .omega. is the angular frequency of the oscillator. An angular frequency .omega. for which the oscillation frequency of the oscillator is f0, indicates .omega.=2.pi..times.f0.

Rewriting formula (1) moreover, yields the formula (4).

$$\omega^2 = (-B \pm \sqrt{(B^2 - 4AC)})/2A \qquad \text{formula (4)}$$

In the formula (4), $A = Rc^2 L^2 C^2 Cpara$ $B = L^2(C+Cpara) + Rc^2 C^2 (R_L^2 Cpara - L)$ $C = R_L^2 (C+Cpara) - L$.

Modification of the First Embodiment

Figure 3:
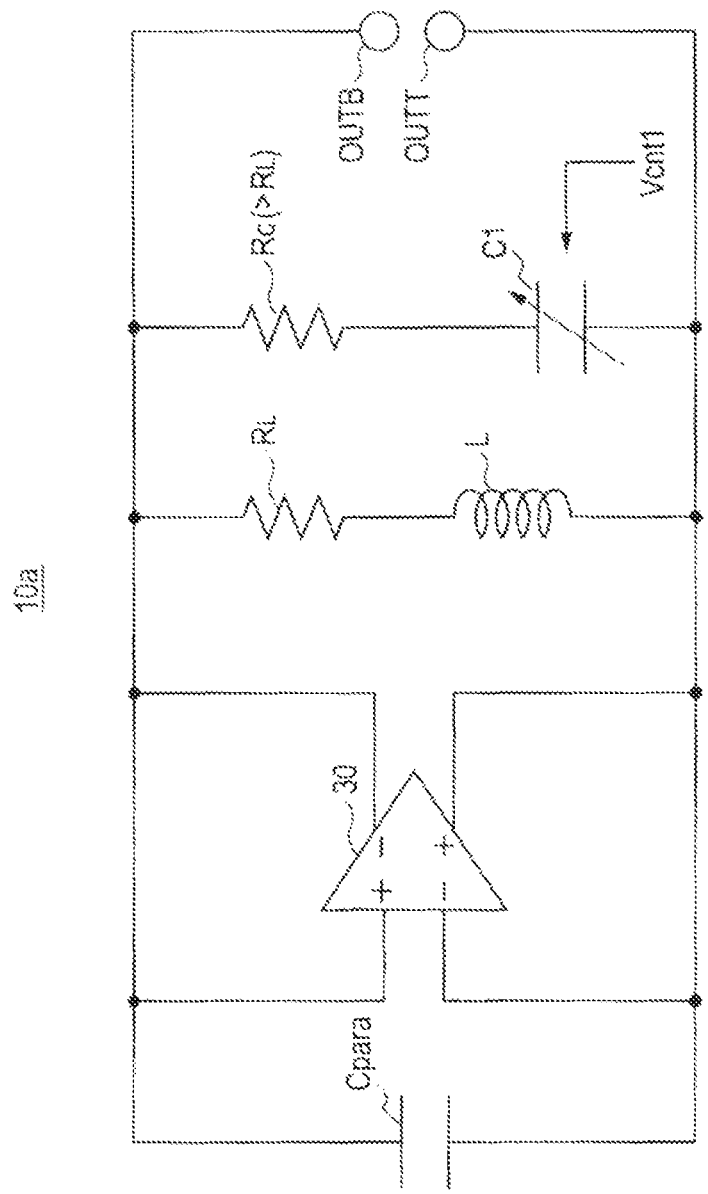
FIG. 3 is an equivalent circuit of an adaptation of the first embodiment having a variable capacitance as the capacitance C1.

FIG. 3 is an equivalent circuit for an oscillator as an adaptation of the first embodiment. The oscillator 10a in FIG. 3 differs from the oscillator 10 of FIG. 1 in that the capacitance element C is changed to a variable capacitance element C1. Other than changing the capacitance element C to a variable capacitance element C1 the circuit structure of the oscillator 10a is identical to the circuit structure of the oscillator 10 in FIG. 1. Changing the capacitance element C to the variable capacitance element C1 allows adjusting the oscillation frequency of the oscillator 10a. The voltage value of the variable capacitive control voltage Vcnt1 regulates the capacitance value of the variable capacitance element C1.

The oscillator 10a in this adaptation of the first embodiment shown in FIG. 3 is capable of adjusting the oscillation frequency by utilizing a variable capacitance element C1 as the variable capacitance element C to regulate the capacitance value by utilizing the voltage value of the variable capacitive control voltage Vcnt1.

Figure 4:
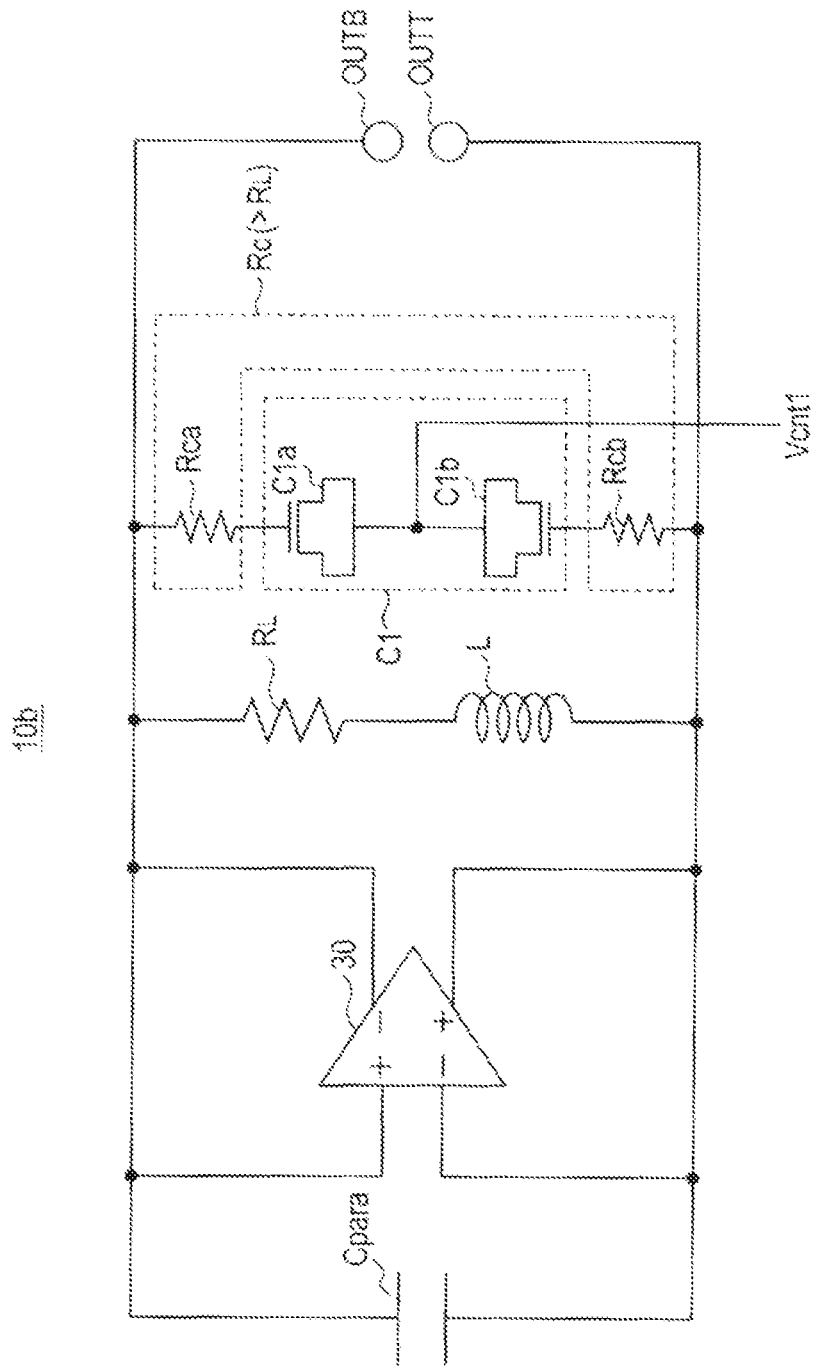
FIG. 4 is a circuit block diagram showing one example of the configuration of the variable capacitance and the first resistance in an adaptation of the first embodiment.

FIG. 4 is a circuit block diagram showing a specific circuit structure of the variable capacitance element C1 in the oscillator 10a in FIG. 3. The variable capacitance element C1 is comprised of a MOS varactor C1a whose gate is coupled by way of a resistance Rca to the inverting output terminal OUTB, and whose source-drain is coupled to the variable capacitive control voltage Vcnt1; and a MOS varactor C1b whose gate is coupled by way of the resistance Rcb to the inverting output amplifier terminal OUTT, and whose source-drain is coupled to the variable capacitive control voltage Vcnt1. The first resistance Rc is placed away from the resistance Rca and resistance Rcb, as an alternating current type equivalent circuit that is equivalent to the circuit in FIG. 3. Fluctuations in the direct current type voltage between the gate and source-drain, change the capacitance value between the gate and source-drain of the MOS varactor so that the capacitance values of the MOS varactors C1a, C1b can be changed by varying the voltage value on the variable capacitive control voltage Vcnt1. In other words, these MOS varactors C1a, C1b function as variable capacitance elements whose capacitance is variable by the voltage value of the variable capacitive control voltage Vcnt1.

The circuit in FIG. 4 is one example for achieving the equivalent circuit in FIG. 3 and can be modified in different ways. In FIG. 4 for example, the variable capacitive control voltage Vcnt1 can be applied to the source-drain of the MOS varactors C1a, C1b, and the gate is coupled by way of the resistance Rca, Rcb to the output terminals OUTB, OUTT. However, the source-drain and the gate of the MOS-varactor may be coupled in reverse, with the source-drain coupled to the resistance Rca, Rcb; and the variable capacitive control voltage Vcnt1 applied to the gate. Moreover, the first resistance Rc and the variable capacitance element C1 are preferably coupled as shown in the circuit in FIG. 4 so that the circuit placement, is symmetrical as seen from the inverting output terminal OUTB and the non-inverting output terminal OUTT.

Second Embodiment

Figure 5:
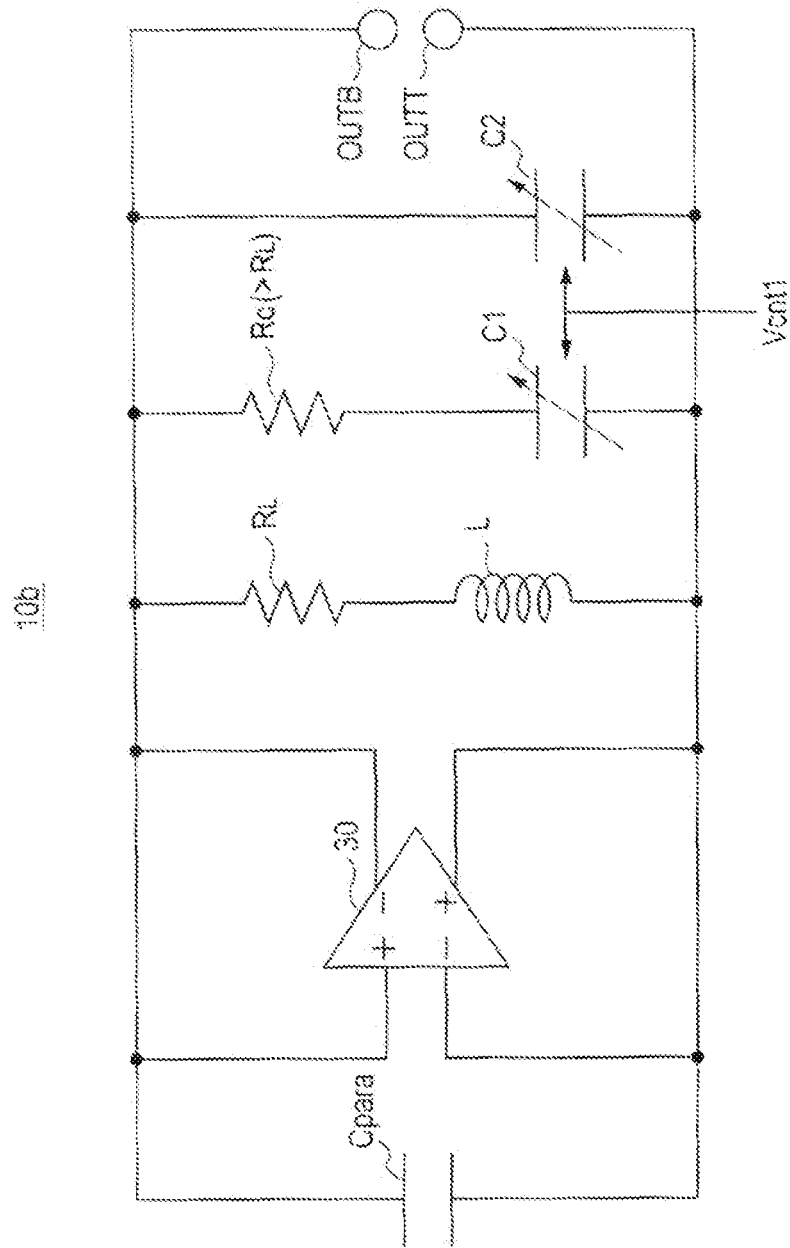
FIG. 5 is a circuit diagram of an equivalent circuit of the oscillator of a second embodiment.

FIG. 5 is a circuit equivalent to the oscillator of the second embodiment. The oscillator 10b in the second embodiment shown in FIG. 5 differs from the oscillator 10a in the adaptation of the first embodiment shown in FIG. 3 in the point that a second variable capacitance element C2 is further coupled between the inverting output terminal OUTB and the non-inverting output terminal OUTT. Except for the point that the second variable capacitance element C2 is added to the oscillator 10a in FIG. 3, the oscillator 10b in FIG. 5 is identical to the oscillator 10a in FIG. 3.

In FIG. 5, though the first variable capacitance element C1 is coupled by way of the first resistance Rc to the inverting output terminal OUTB and the non-inverting output terminal OUTT, the second variable capacitance element C2 is coupled to the inverting output terminal OUTB and the non-inverting output terminal OUTT without passing through the first resistance Rc. Also, the capacitance value of the second variable capacitance element C2 is regulated by the variable capacitive control voltage Vcnt1, the same as with the first variable capacitance element C1.

In the oscillator 10b of the second embodiment shown in FIG. 5, the capacitance C is made a variable capacitance C1 the same as the adaptation of the first embodiment shown in FIG. 3 and so the oscillation frequency is adjustable. The second embodiment moreover has a second variable capacitance element C2 so that when adjusting the oscillation frequency by changing the capacitance value, the effect from the temperature characteristics on the frequency is minimized even further than in the adaptation of the first embodiment.

Figure 6:
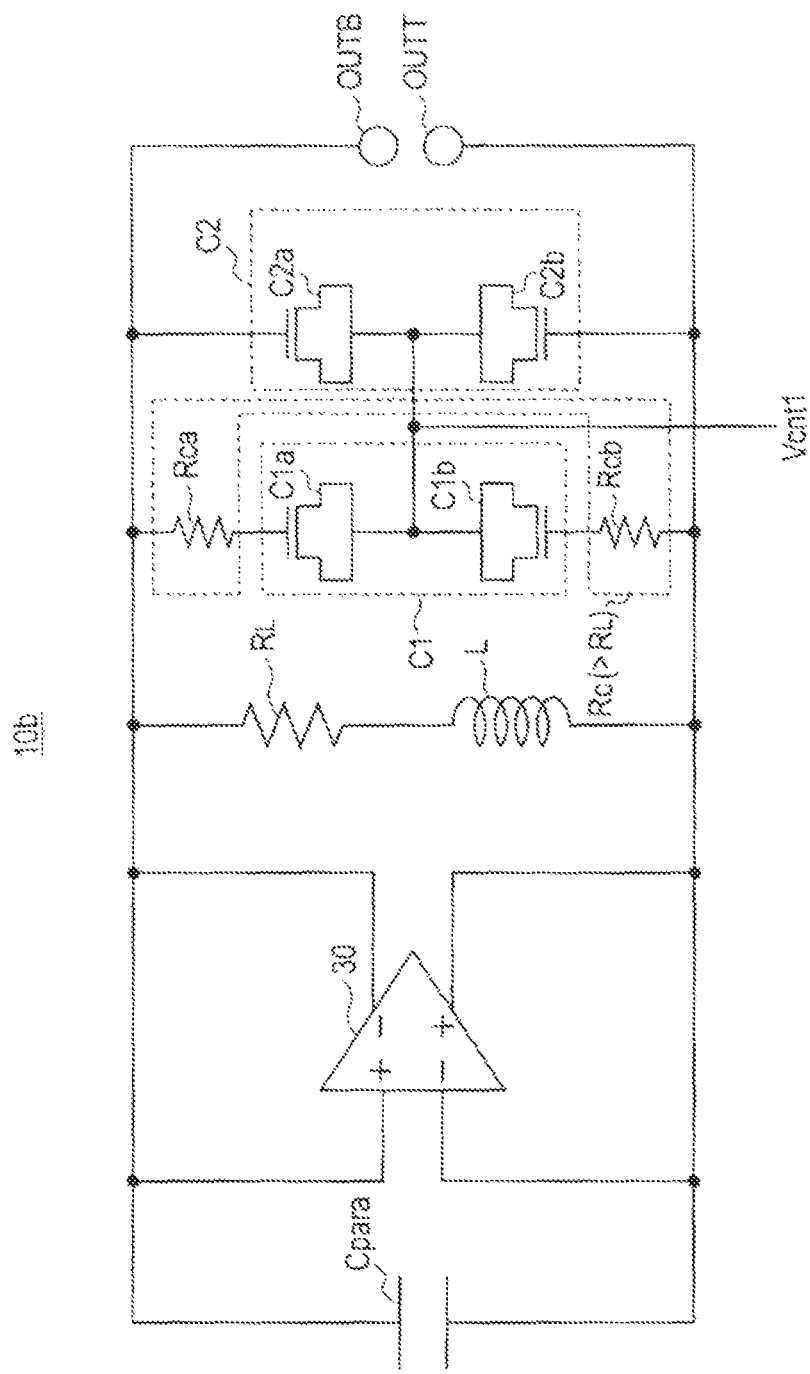
FIG. 6 is a circuit block diagram showing one example of the configuration of the variable capacitance and the first resistance in the oscillator of a third embodiment.

FIG. 6 is a circuit block diagram showing the specific circuit structure of the first and the second variable capacitance element C1, C2, and the first resistance Rc in the oscillator 10b of FIG. 5. The circuit structures of the first variable capacitance element C1 and the first resistance element Rc is identical to the circuit structure in FIG. 4 that was already described so a description is omitted.

In FIG. 6, the second variable capacitance element C2 is comprised of a MOS varactor C2a whose gate is coupled to the inverting output terminal OUTB, and whose source-drain is coupled to the variable capacitive control voltage Vcnt1; and a MOS varactor C2b whose gate is coupled to the non-inverting output terminal OUTT, and whose source-drain are coupled to the variable capacitive control voltage Vcnt1. The value of the capacitance between the gate and source-drain of the MOS varactors C2a, C2b are adjustable by a DC type voltage between the source-drain and gate so that the capacitance value of the MOS varactors C2a, C2b can be adjusted by varying the voltage value of the variable capacitive control voltage Vcnt1. The MOS varactors C2a, C2b in other words function as variable capacitance element whose capacitance is variable by the voltage value of variable capacitive control voltage Vcnt1. The MOS varactors C2a, C2b are serially coupled between the inverting output terminal OUTB and the non-inverting output terminal OUTT to function as an alternating current type equivalent circuit as shown in FIG. 5, acting as variable capacitance element whose capacitance value is controlled by the variable capacitive control voltage Vcnt1 coupled between the inverting output terminal OUTB and the non-inverting output terminal OUTT.

Though the variable capacitance element C1 is coupled by way of the resistance Rca, Rcb to the output terminals (OUTB, OUTT), the variable capacitance element C2 is coupled to the output terminals (OUTB, OUTT) without using the resistance and so even if the variable capacitance elements C1, C2 are controlled by the same variable capacitive control voltage Vcnt1, the variable capacitance elements C1, C2 will exhibit mutually different capacitive characteristics corresponding to the voltage value of variable capacitive control voltage Vcnt1. Fluctuations in the oscillation frequency relative to temperature changes can be minimized even in cases where adjusting the oscillation frequency by changing the capacitance value through utilizing the difference in capacitive characteristics relative to this control voltage.

The circuit in FIG. 6 is one example for achieving the equivalent circuit of FIG. 5, and can be rendered in various configurations. The gate and source-drain of the MOS varactors C2a, C2b for example can be coupled in reverse, the same as the MOS varactors C1a, C1b. The source-drain is in other words coupled to the output terminals OUTB, OUTT, and a variable capacitive control voltage Vcnt1 is applied to the gate to control the capacitance value. However, the circuit structure of the oscillator such as the first and second variable capacitors C1, C2, and first resistance Rc should preferably be symmetrical as seen from the output terminals (OUTB, OUTT) in order to achieve a stable oscillator with minimal jitter.

Third Embodiment

Figure 7:
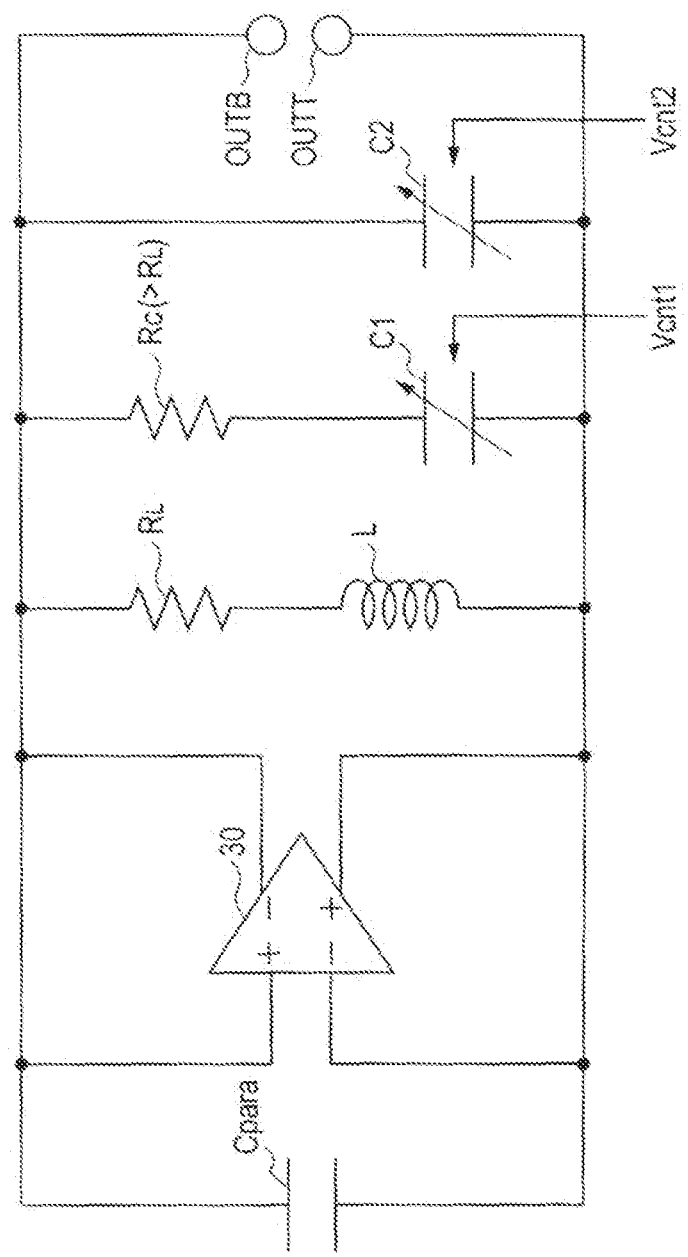
FIG. 7 is a circuit diagram of an equivalent circuit of the oscillator of the third embodiment.

FIG. 7 is a circuit diagram showing a circuit equivalent to the oscillator of the third embodiment. In contrast to the oscillator 10b of the second embodiment shown in FIG. 5, the oscillator 10c in the third embodiment shown in FIG. 7 differs in the point that the first variable capacitive control voltage Vcnt1 regulates the capacitance value of the first variable capacitance element C1, and the second variable capacitive control voltage Vcnt2 regulates the capacitance value of the second variable capacitance element C2. In other words, unlike the oscillator 10b of the second embodiment in which a common control voltage Vcnt1 regulates the first variable capacitance element C1, and the second variable capacitance element C2; in the oscillator 10c of the third embodiment, the first variable capacitance element C1, and the second variable capacitance element C2 can be controlled by applying respectively separate control voltages. Among the first and second variable capacitive control voltages Vcnt1, Vcnt2; the second variable capacitive control voltage Vcnt2 may be set to apply a control voltage whose voltage changes at a fixed rate versus voltage changes in the first variable capacitive control voltage Vcnt1; or the first variable capacitive control voltage Vcnt1 and second variable control voltage Vcnt2 may be set to exert control separately.

When adjusting the oscillation frequency of the oscillator 10c, the above described configuration can maintain an optimal ratio between the capacitance value C1 installed by way of the first resistance Rc between the inverting output terminal OUTS and the non-inverting output terminal OUTT, and the capacitance values Cpara plus C2 installed between the inverting output terminal OUTB and the non-inverting output terminal OUTT but not by way of the first resistance Rc. The temperature characteristics can therefore be compensated with higher accuracy even when changing the oscillation frequency of the oscillator 10c.

Figure 8:
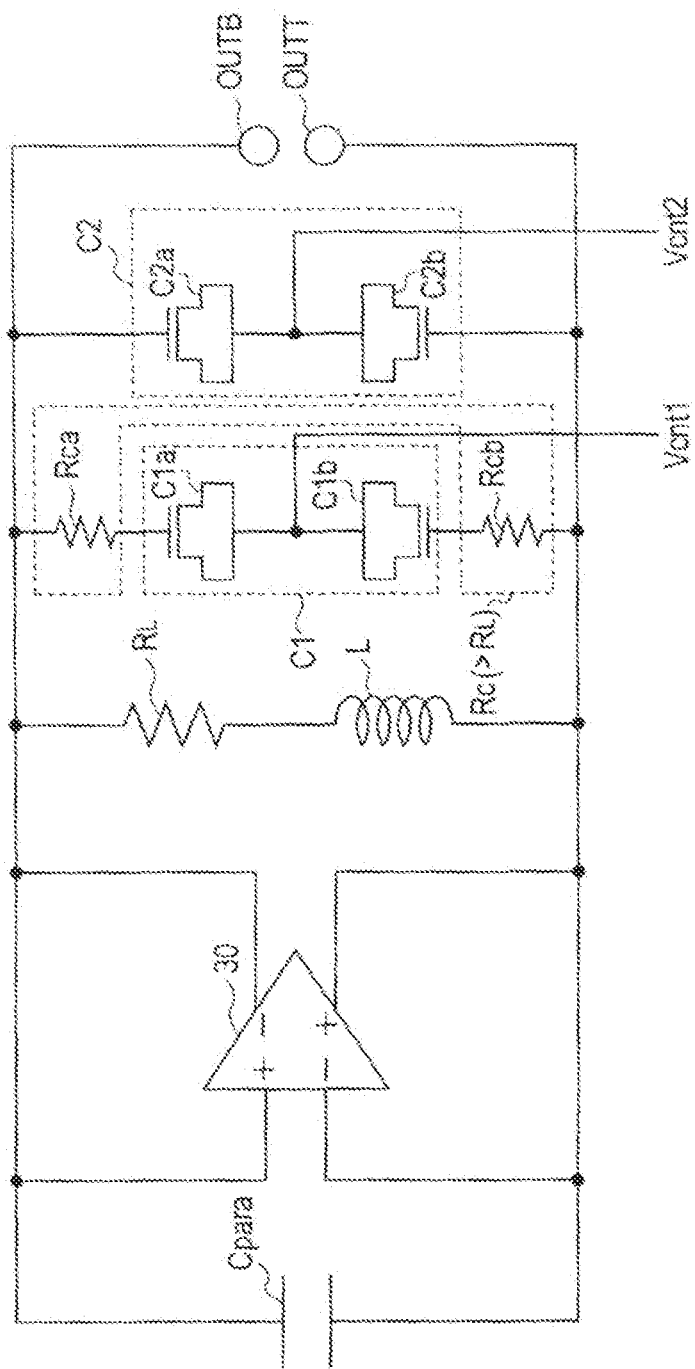
FIG. 8 is a circuit block diagram showing one example of the configuration of the variable capacitance and the first resistance in the oscillator of the third embodiment.

FIG. 8 is a circuit block diagram showing a specific circuit structure of the first and the second variable capacitance elements C1, C2 and the first resistance element Rc in the oscillator 10c of FIG. 7. The circuit block diagram of the third embodiment shown in FIG. 7 is identical to the circuit block diagram of the second embodiment shown in FIG. 6 except for the points that a first variable capacitive control voltage Vcnt1 is applied to the source-drain of the MOS varactors C1a and C1b, and that a second variable capacitive control voltage Vcnt2 is applied to the source-drain of the MOS varactors C2a and C2b. Applying different control voltages to the MOS varactors C1a and C1b and MOS varactors C2a and C2b allows more freedom in changing the capacitance values of the variable capacitance element C1 and variable capacitance element C2. The temperature characteristics can therefore be compensated with greater accuracy when adjusting by changing the oscillation frequency of the oscillator 10.

The irregularities or variations in oscillation frequency for example sometimes require adjustment in order to oscillate at a fixed frequency from compensating for process irregularities, however even in those cases, this embodiment can provide an oscillator that oscillates at a fixed frequency even if temperature characteristics are compensated and the temperature fluctuates.

Fourth Embodiment

Figure 17:
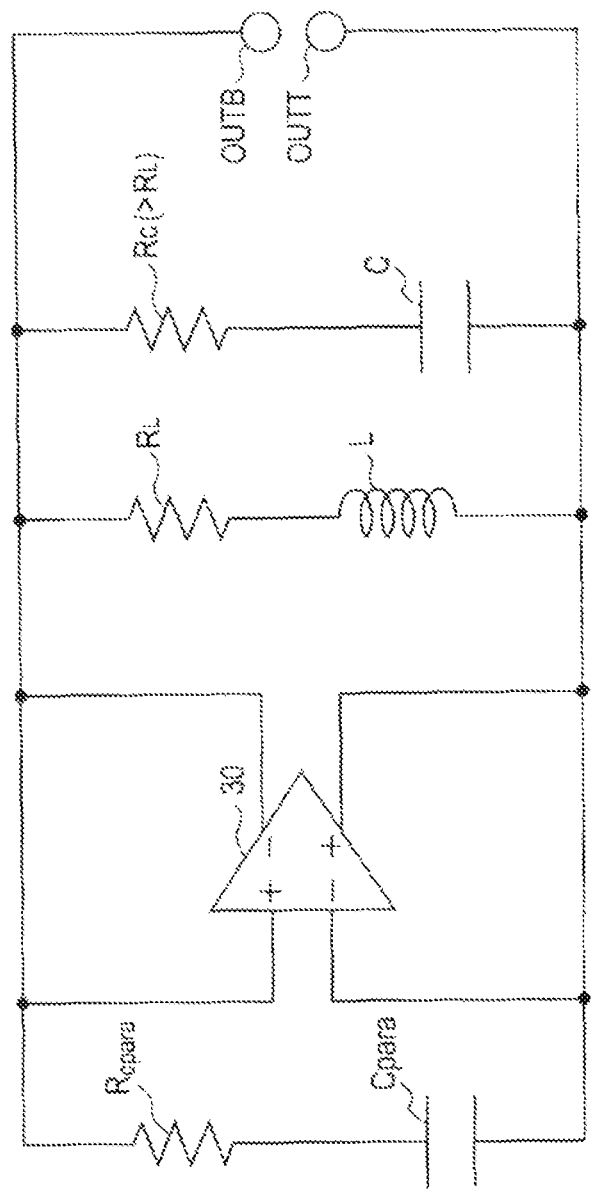
FIG. 17 is a circuit diagram of an equivalent circuit of the oscillator of a fourth embodiment.

The description of the first through third embodiments described the parasitic capacitance Cpara is a directly parasitic capacitance between the inverting output terminal OUTB and the non-inverting output terminal OUTT of the oscillator. However, when even greater accuracy in the oscillator is required, the resistance value of the second parasitic resistance serially coupled between the inverting output terminal OUTS and the non-inverting output terminal OUTT to the parasitic capacitance Cpara may sometimes be impossible to ignore. Rewriting the equivalent circuit of the first embodiment to account for the second parasitic resistance gives the circuit as shown in FIG. 17. In the oscillator 10d in FIG. 17, the second parasitic resistance serially coupled with the parasitic capacitance Cpara between the inverting output terminal OUTS and the non-inverting output terminal OUTT is shown as Rcpara. If the capacitance value C of the capacitance element and the resistance value Rc of the first resistance element are set to satisfy the following formula (2) and formula (3) to account for this second parasitic resistance Rcpara, then the oscillator can be compensated for effects of the second parasitic resistance Rcpara on the temperature characteristics.

$$C \times Rc = Cpara \times Rcpara \quad \text{formula (2)}$$

$$Rc \times Rcpara = R_L \times (Rc + Rcpara) \quad \text{formula (3)}$$

In the above formula (2) and formula (3), Cpara denotes the capacitance value of the parasitic capacitance, Rcpara denotes the resistance value of the second parasitic resistance, and $R_L$ denotes the resistance value of the parasitic resistance of the inductance element. The second parasitic resistance Rcpara is the parasitic resistance of the metallic wiring. The inductance element L is the same material (metallic wiring) as the first resistance Rc. The resistance temperature coefficient of the second parasitic resistance Rcpara is therefore equivalent to the resistance temperature coefficient of the inductance element L and the first resistance Rc.

Though dependent on the oscillator layout in the semiconductor integrated circuit, the second parasitic resistance Rcpara can be a small resistance value compared to the unavoidably large parasitic resistance of the inductance element L and the first resistance Rc having an even larger resistance value. The second parasitic resistance Rcpara can therefore be made small enough to ignore, just as was described in the first through the third embodiments.

Fifth Embodiment

Figure 9:
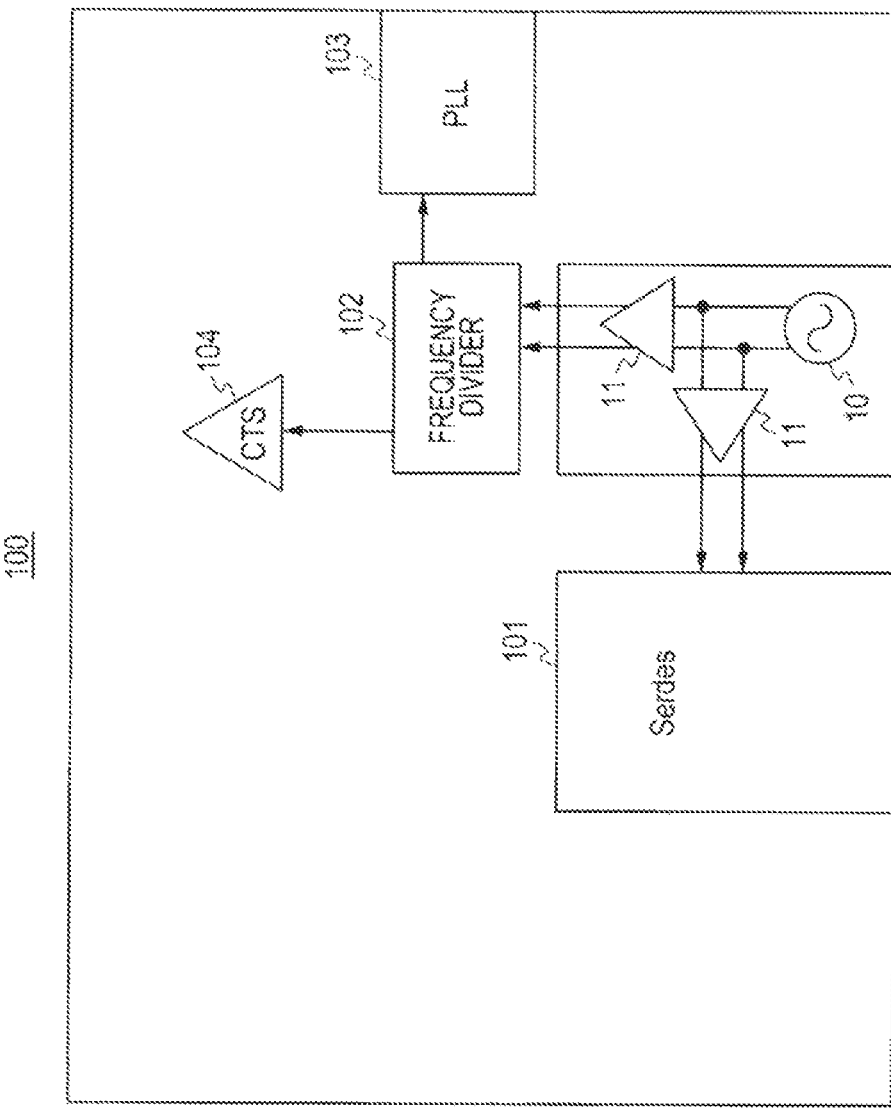
FIG. 9 is a circuit block diagram of the semiconductor integrated circuit device of a fifth embodiment.

FIG. 9 is a circuit block diagram of the semiconductor integrated circuit device of the fifth embodiment. The semiconductor integrated circuit device 100 includes a circuit configured over the semiconductor substrate not shown in the drawing. The oscillator 10 is the oscillator as described in any of the first through the third embodiments. The signal output from the output terminals OUTT, OUTB of the oscillator is further amplified by the clock driver 11, and coupled to an external circuit block. The Serdes circuit 101 is one example of a circuit block requiring a high-speed clock, and the clock output from the clock driver 11 is supplied unchanged to the without being subdivided. The Serdes circuit 101 converts the signal output in parallel from a circuit block not shown in the drawing within the semiconductor integrated circuit device 100, to a serial signal synchronized with the clock output from the clock driver 11, and outputs this to a section outside the semiconductor integrated circuit device 100. Moreover, the data sent as a serial signal from a section outside the semiconductor integrated circuit device 100 is converted to a parallel signal by utilizing the clock signal output from the clock driver 11, and is output to a circuit block to an internal circuit block of the semiconductor integrated circuit device 100 not shown in the drawing.

The frequency divider circuit 102 subdivides the clock signal that was output from the clock driver 11, and generates a lower frequency clock signal with minimal jitter. By using the frequency divider circuit 102 to subdivide the high cycle signal output from the oscillator 10 in order to obtain a low frequency signal, a stable clock signal with minimal jitter compared to the clock signal output from the oscillator 10 itself can be obtained. A certain amount of jitter is unavoidable in the clock signal output from the oscillator 10 itself just as is the case with any type of oscillator however the jitter can be reduced by subdividing the clock signal into a lower frequency signal. From the standpoint of generating a clock signal with minimal jitter, the clock frequency generated by the oscillator 10 is preferably an oscillator 10 capable of oscillating at a frequency higher than the clock signal that is actually required. By utilizing the frequency divider circuit 102, a low-frequency minimal-jitter clock signal can be generated from the high frequency signal output from this oscillator 10.

The clock signal that was subdivided by the frequency divider circuit 102 is supplied to the PLL circuit 103 as a reference clock signal. The PLL circuit 103 generates a synchronization signal required for sending and receiving data to and from a section outside the semiconductor integrated circuit device 100. The clock signal that was subdivided by the frequency divider circuit 102 is supplied by way of the CTS circuit to each section within the semiconductor integrated circuit device 100 as a system clock signal for the entire semiconductor integrated circuit device 100.

The oscillator 10, the clock driver 11, the Serdes circuit 101, the frequency divider circuit 102, the PLL circuit 103, and the CTS circuit 104 can be formed over the single semiconductor substrate within the semiconductor integrated circuit device 100.

The clock signal output from the oscillator 10 can be supplied as the operation clock to the internal circuits (Serdes 101, frequency divider circuit 102, PLL circuit 103, CTS circuit 104, etc.) that operate in synchronization with the clock signal as already described. A clock signal capable of compensating the temperature characteristics can be supplied by utilizing any of the oscillators described in the first through the third embodiments for the oscillator 10.

Sixth Embodiment

Figure 10:
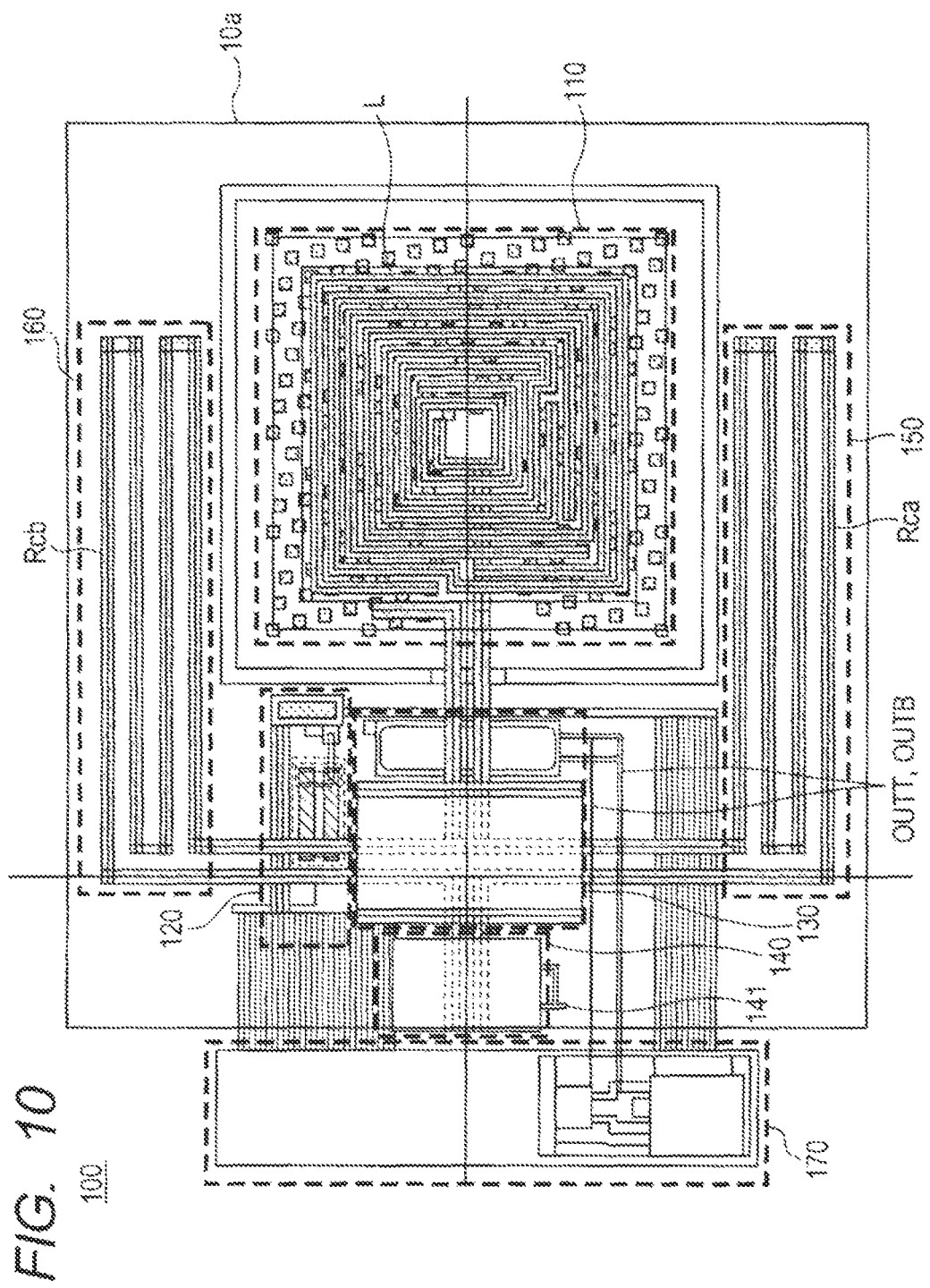
FIG. 10 is a plan (flat) view showing the layout of the oscillator formed over the semiconductor substrate of a sixth embodiment.

FIG. 10 is a plan (flat) view showing the preferred layout when placing each of the circuit element of the oscillator 10a over the semiconductor substrate of the semiconductor integrated circuit device 100. The oscillator 10a placed in FIG. 10 is the oscillator 10a of the adaptation in the first embodiment shown in FIG. 4 so the first resistance Rc is positioned at two separate locations, and the second variable capacitance C2 are not included in the flat plan layout of FIG. 10.

The inductance element L in FIG. 10 is positioned in a helical shape within the inductance element positioning region 110 over the surface of the semiconductor substrate. The inductance element L is wired as metallic wiring in a helical shape (whirlpool shape, spiral shape) in order to minimize the parasitic resistance as much as possible. Moreover, multilayer metallic wiring layers are utilized in order to obtain the desired inductance and a wiring pattern in a helical shape may be formed spanning the multilayer metallic wiring layers. The multilayer metallic wiring layers are coupled by through-holes formed in the metallic wiring. Moreover, a layout that minimizes the parasitic resistance as much as possible may be rendered by coupling in series the helical wiring patterns formed on each of the metallic wiring layers to lower the parasitic resistance. The typical metallic wiring layer such as of copper or aluminum utilized in the semiconductor integrated circuit device can be utilized for the metallic wiring.

The first resistance Rc is separately positioned as the first resistance Rca positioned over the first resistance positioning region 150; and the second resistance Rcb positioned over the second resistance positioning region 160. The first resistance Rca and the second resistance Rcb are both wired in the same metallic wiring as the inductance element L. The resistance temperature coefficients of the inductance element L and first resistance Rca and second resistance Rcb are therefore mutually equivalent. If there are irregularities in the resistance values of the inductance element L parasitic resistance due to irregularities in the manufacturing process, then irregularities will also appear in the same way in the resistance values of the first resistance Rca, and the second resistance Rcb.

The first resistance Rca is placed by looping back in the resistance positioning region 150 in order to attain the specified resistance value. The length from one end to the other end of the first resistance Rca is positioned so as to be longer than the maximum diameter (length) of the inductance element positioned in a helical shape. The wire from the first resistance positioning region 150 to the driver positioning region 130 is included as a portion of the first resistance Rca.

The second resistance Rcb is enclosed by the inductance positioning region 110, and is positioned over the second resistance positioning region 160 in a position symmetrical to the first resistance Rca. The second resistance Rcb is positioned in a symmetrical shape so that the resistance value of the second resistance Rcb is equivalent to the resistance value of the first resistance Rca.

Circuits other than the bias voltage generator section 31 (See FIG. 2) of the oscillator 30 are positioned over the driver positioning region 130. The bias voltage generator section 31 is positioned over the bias voltage generator section positioning region 120. The variable capacitance element C1 is positioned over the variable capacitance positioning region 140. The inverting output terminal OUTB and the non-inverting output terminal OUTT of the driver positioning region 130 are coupled by wiring to the secondary amplifier circuit 170 serving as the circuit the external sections of the oscillator 10a. Wiring from external sections is coupled to the variable capacitance control voltage input terminal 141 of the variable capacitance positioning region 140.

In the above layout, the inductance element L is positioned over the inductance element positioning region 110. The driver positioning region 130 and the variable capacitance positioning region 140 are positioned adjacent to the inductance element positioning region 110. The first resistance positioning region 150 and the second resistance positioning region 160 are positioned in a symmetrical to the region adjacent to the inductance element positioning region 110, enclosing the inductance element positioning region 110, the driver positioning region 130, and the variable capacitance positioning region 140 between them. In the placement in FIG. 10, the first resistance positioning region 150 and the second resistance positioning region 160 are positioned symmetrically relative to the inductance element L and the driver positioning region 130, and the variable capacitance positioning region 140 so that the oscillator 10 circuit characteristics can be easily obtained as an oscillator with symmetrical characteristics as seen from the output terminals OUTT, OUTB.

EXAMPLES

Results verified from simulations made for temperature characteristics of oscillators in the first through the third embodiments are described for the first through the fifth examples.

Example 1

Figure 11:
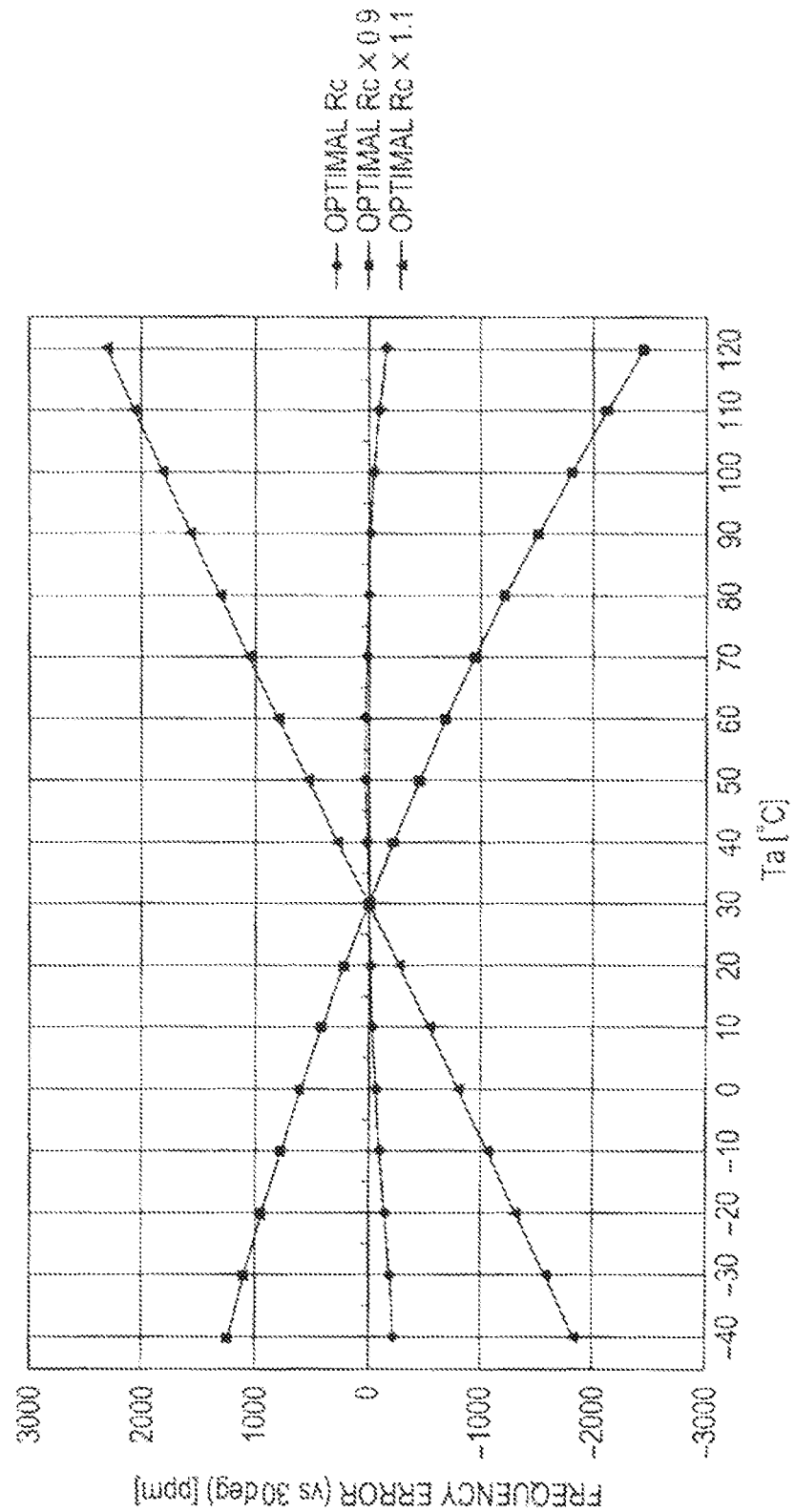
FIG. 11 is a graph showing the oscillation frequency temperature dependence in an example 1 based on the first embodiment.

FIG. 11 is a graph showing temperature dependence in the oscillator of the first embodiment. The example 1 is based on the first embodiment shown in FIG. 1 and FIG. 2. Specific temperature characteristics of the oscillator 10 of the first embodiment were found by temperature simulation. In example 1 shown in FIG. 11, an optimal resistance value for the first resistance Rc was found by simulation using L=10 nH, $R_L$=100Ω, C=Cpara=20 fF (=0.02 pF) for the oscillator 10 in FIG. 1. Here, $R_L$100Ω is the value at 30° C., and resistance temperature coefficient α was set to α=3=10$^{-3}$. The optimal value of Rc found by this simulation was 297Ω, and was a value approximately three times the parasitic resistance $R_L$.

The horizontal axis in FIG. 11 is the peripheral temperature Ta [° C.]. The vertical axis is the error in the oscillation frequency relative to the oscillation frequency at a peripheral temperature of 30° C. Setting the first resistance Rc to an optimal resistance value (297Ω) as shown in FIG. 11, yielded an oscillation frequency width of approximately 250 ppm within a temperature range of −40° C. through 120° C.; however, one can see that the oscillation frequency can be observed to expand (worsen) to approximately 4000 ppm when set to 0.9 times or to 1.1 times the optimal value (297Ω) of the resistance value of the first resistance Rc.

Example 2

Figure 12:
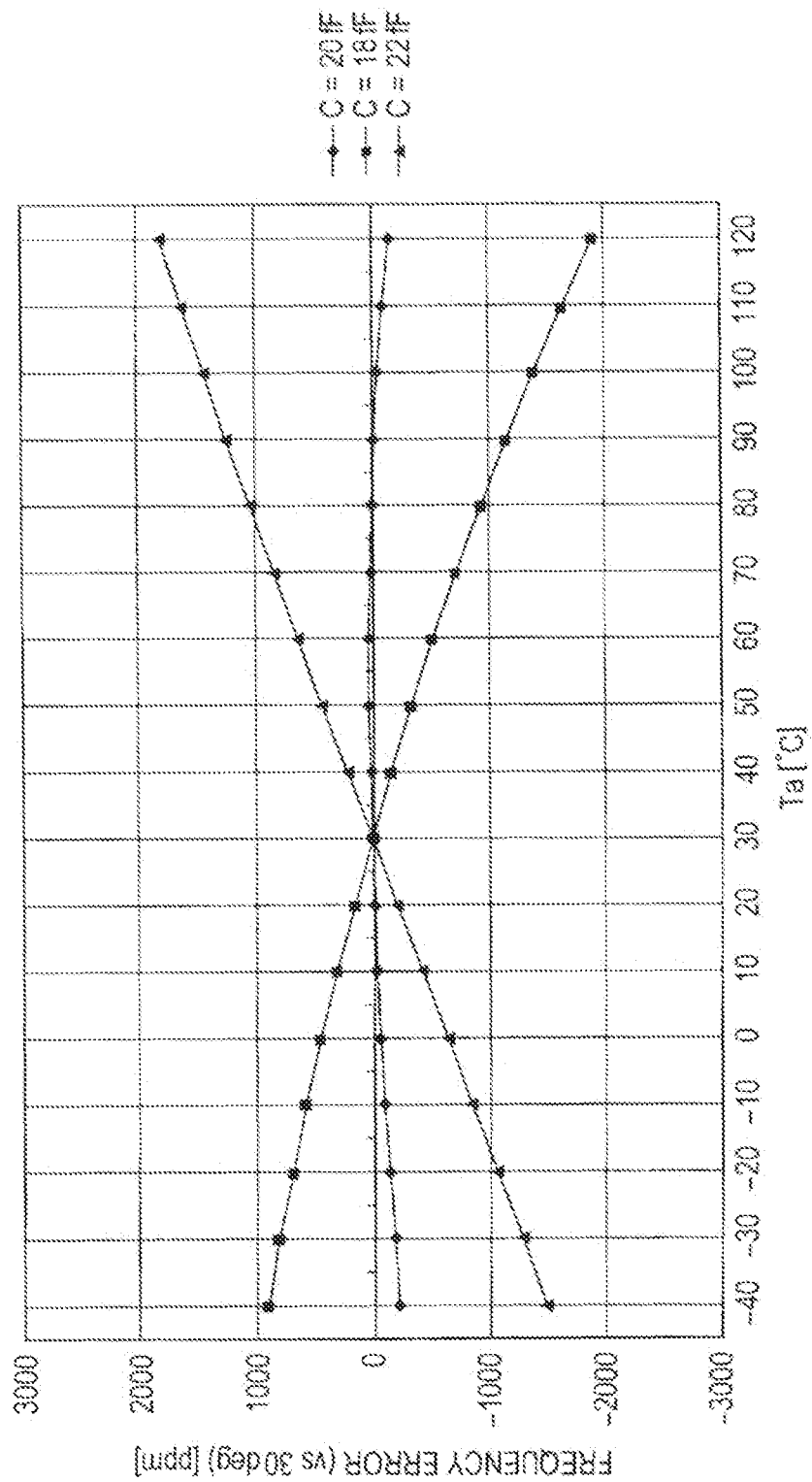
FIG. 12 is a graph showing the oscillation frequency temperature dependence in an example 2 based on a modification of the first embodiment.

FIG. 12 is a graph showing the temperature dependence of the oscillator in example 2. The example 2 is an example based on the adaptation of the first embodiment shown in FIG. 3 and FIG. 4. Specific temperature characteristics of the oscillator 10a in the adaptation of the first embodiment were found by simulation. In the example 2 shown in FIG. 12, the oscillator 10a in the adaptation of the first embodiment shown in FIG. 3 was set so that the L=10 nH, $R_L$100Ω, Cpara=20 fF (=0.02 pF), and Rc=297Ω. The $R_L$, Rc values are the values at a temperature of 30° C. The resistance temperature coefficients .alpha. of $R_L$ and Rc were set to α=3=10$^{-3}$. The capacitance value C of the variable capacitance element C1 which were C=20 fF, C=18 fF, C=22 fF were each carried out by simulation. As already described, the oscillation frequency of the LC oscillator is expressed as approximately $1/(2\pi\sqrt{(LC)})$ so if the capacitance value C of the variable capacitance element C1 was changed then the oscillation frequency itself will be different at C=20 fF, C=18 fF, and C=22 fF. FIG. 12 shows the frequency error per the difference at respective oscillation frequencies when the temperature was changed based on an oscillation frequency of 30° C.

The horizontal axis in FIG. 12 shows the peripheral temperature Ta [° C.]. The vertical axis shows the error in the oscillation frequency relative to the oscillation frequency at a peripheral temperature of 30° C. As shown in FIG. 12, the resistance value of the first resistance Rc is set so as to compensate the temperature characteristics when the capacitance value of the variable capacitance C1 is C=20 fF so that the oscillation frequency width at C=20 fF is approximately 250 ppm in a temperature range of −40° C. through 120° C. However, an expansion (worsening) of the oscillation frequency width of approximately 3500 ppm can be observed when the capacitance value of the variable capacitance C1 was fluctuated 10 percent to 18 fF and to 22 fF.

Example 3

Figure 13:
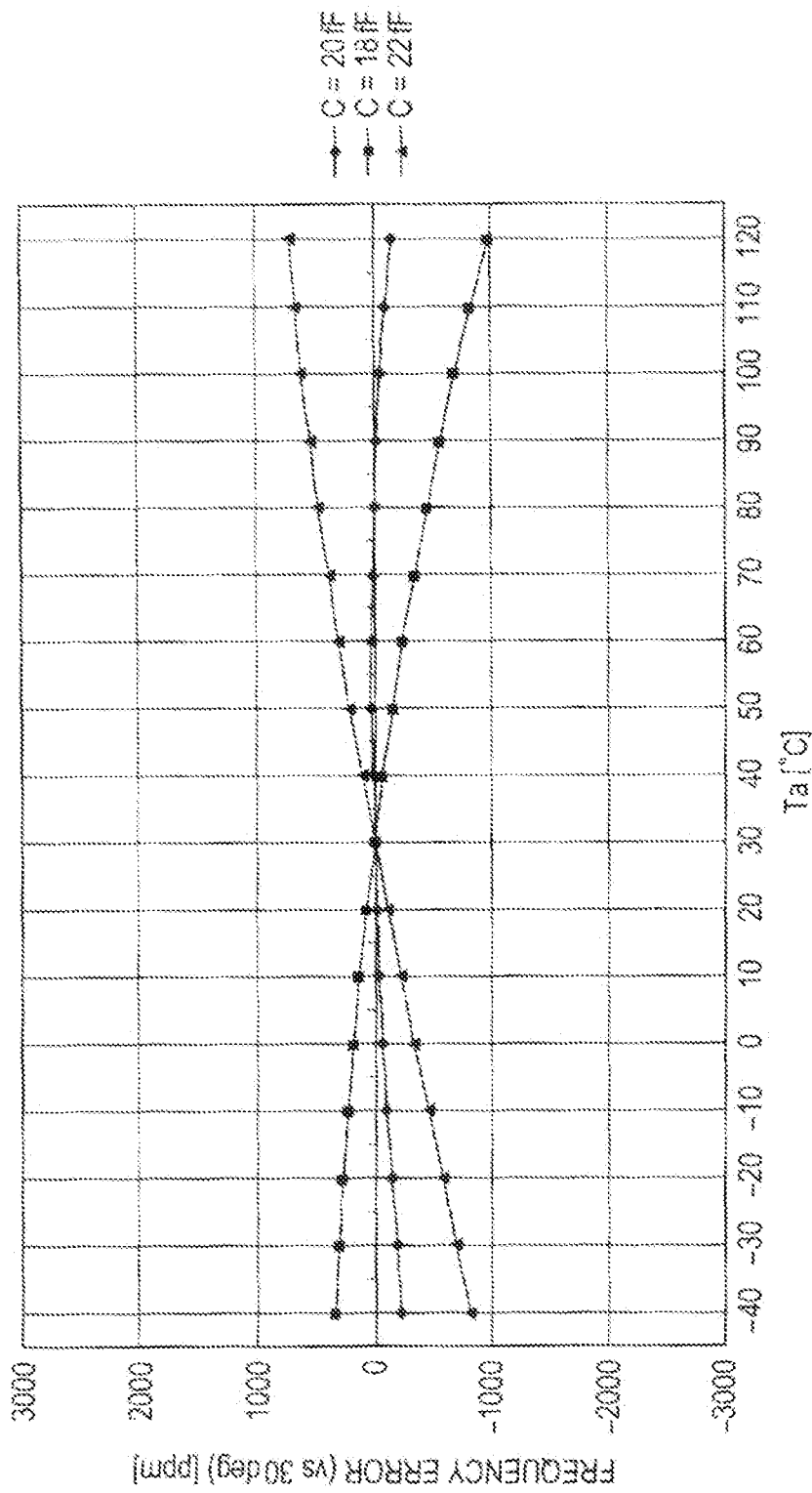
FIG. 13 is a graph showing the oscillation frequency temperature dependence in an example 3 based on the second embodiment.

FIG. 13 is a graph showing the temperature dependence of the oscillator in example 3. The example 3 is an example based on the second embodiment shown in FIG. 5 and FIG. 6. Specific temperature characteristics of the oscillator 10b of the second embodiment were found by simulation. In the example 3 shown in FIG. 13, the oscillator 10b of FIG. 5 was set so that the L=10 nH, $R_L$100Ω, Cpara=10 fF (=0.02 pF), and Rc=297Ω. The capacitance values of C1 and C2 were fixed at C1=20 fF, C2=10 fF when a standard bias voltage (variable capacitive control voltage) Vcnt1 was applied.

The above described $R_L$ and Rc were the values at a temperature of 30° C. The resistance temperature coefficients a of $R_L$ and Rc were set to $\alpha 3 \times 10^{-3}$. Moreover, the capacitance value C of the variable capacitance element C1 which was C=20 fF, C=18 fF, and C=22 fF were each carried out by simulation.

The horizontal axis in FIG. 13 shows the peripheral temperature Ta [° C.]. The vertical axis shows the error in the oscillation frequency relative to the oscillation frequency at a peripheral temperature of 30° C. As shown in FIG. 13, the capacitance values of the capacitance Cpara+C2 directly coupled between the inverting output terminal OUTB and the non-inverting output terminal OUTT without passing through the first resistance element Rc fluctuate along with fluctuations that occur in the capacitance C of the variable capacitance C1. Therefore, the frequency error that occurs when the capacitance value C of variable capacitance C1 was changed from a center value of 20 fF to 18 fF and 22 fF can be suppressed compared to example 2 shown in FIG. 12. When the capacitance value of the variable capacitance C1 was changed 10 percent to 18 fF and 22 fF in the second example in FIG. 12, the oscillation frequency width was approximately 3500 ppm, however in example 3 shown in FIG. 13 the oscillation frequency width stayed within 2000 ppm (was improved).

Example 4

Figure 14:
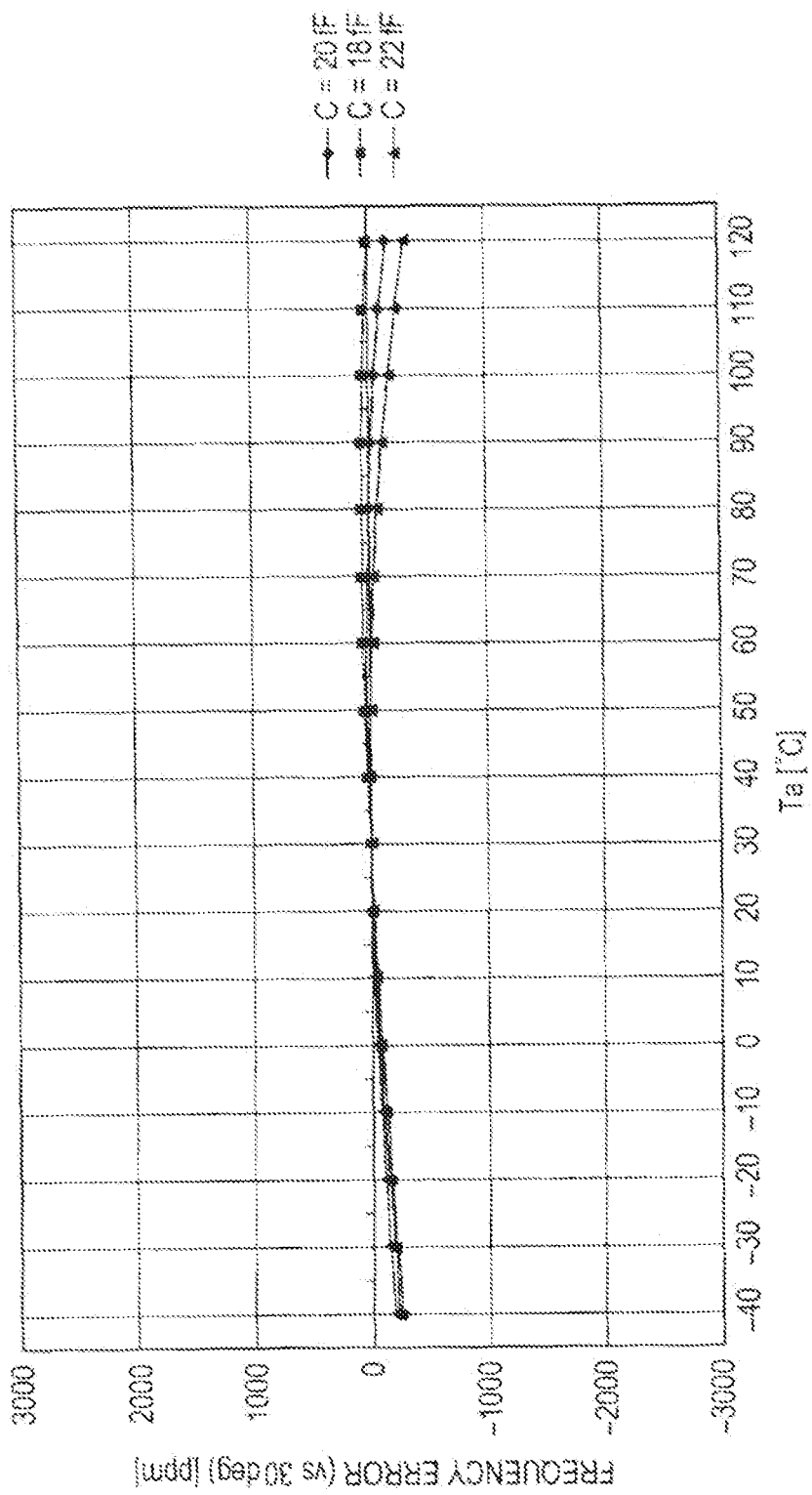
FIG. 14 is a graph showing the oscillation frequency temperature dependence in an example 4 based on the third embodiment.

FIG. 14 is a graph showing the temperature dependence of the oscillator in example 4. The example 4 is an example based on the third embodiment shown in FIG. 7 and FIG. 8. Specific temperature characteristics of the oscillator 10c in the third embodiment were found by simulation. In the example 4 that is shown in FIG. 14, the control voltage ΔVcnt2/ΔVcnt1=2. In other words, the second variable capacitive control voltage Vcnt2 is controlled so as to double relative to a change in the first variable capacitive control voltage Vcnt1. All other simulation conditions were identical to those in example 3 shown in FIG. 13. Consequently, when the capacitance value of the variable capacitance C1 is changed 10 percent to 18 fF and 22 fF as shown in FIG. 14, then the oscillation frequency width when the temperature is changed from −40° C. through 120° C. drastically lowered (was improved) more than in example 3 shown in FIG. 13.

Example 5

Figure 15:
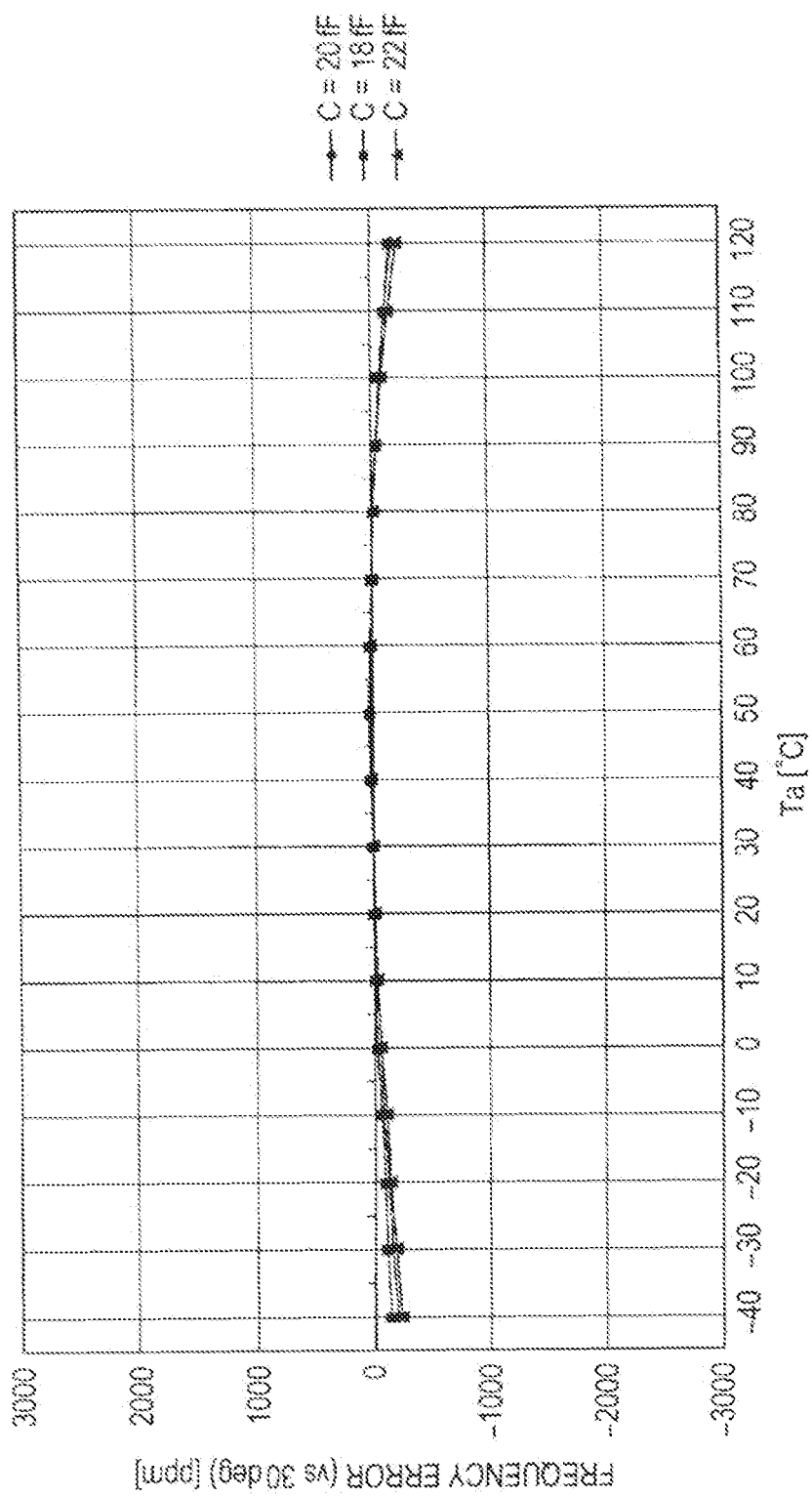
FIG. 15 is a graph, showing the oscillation frequency temperature dependence in an example 5 based on the third embodiment.
Figure 16:
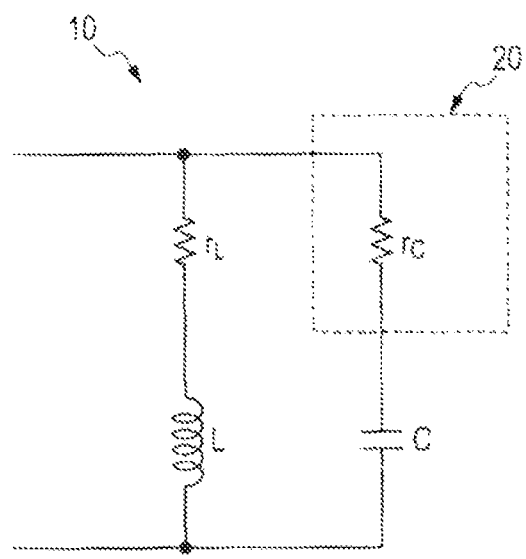
FIG. 16 is a circuit diagram showing the (temperature compensated) LC oscillator tank operated at the temperature null phase described in Japanese Unexamined Patent Publication No. 2010-50973.

FIG. 15 is a graph showing the temperature dependence of the oscillator in example 5. Example 5 just the same as example 4, is an example made by simulation based on the third embodiment. In example 5, the ratio of the control voltage ΔVcnt2/ΔVcnt1 was adjusted even more finely than in example 4, so that the ratio in example 5 was ΔVcnt2/ΔVcnt1=1.87. In other words, the second variable capacitive control voltage Vcnt2 is controlled so as to increase 1.87 times relative to a change in the first variable capacitive control voltage Vcnt1. All other simulation conditions were identical to those in example 4. The oscillation frequency width as shown in FIG. 15 was stabilized (range of fluctuation decreased) even further than, in example 4 shown in FIG. 14.

In the above described first through fourth embodiments, the adjustment method utilized during the design in order to attain optimal temperature characteristics in the oscillator was to allow adding a fixed adjustment capacitance in parallel with the parasitic capacitance Cpara. Another method may be utilized to adjust the oscillator to optimal characteristics in the design stage by first deciding the value of the first resistance Rc in the same way, and then make fine adjustments to the layout of the inductance element. In this case, by setting the first resistor Rc to a fixed resistance value first, and then by adding a fixed capacitance value and resistance values such as the parasitic resistance $R_L$ (or a resistor pattern added in serial to the inductance element L) coupled in parallel with the parasitic capacitance Cpara, an oscillator with optimal temperature characteristics can be achieved during the design stage.

All manner of changes and adjustments are allowable within the scope of the fully disclosed present invention (including the drawings), moreover changes and adjustments are permitted in the examples based on those fundamental technical concepts. Diverse combinations of the various elements within the scope of the claims of the present invention are also permissible. Namely, as is apparent to one skilled in the art, all types of variations and corrections that comply with the scope and spirit of the technical concepts and the full disclosure of the present invention including the claims and the accompanying drawings are permissible.

What is claimed is:

1. An oscillator comprising:
    an inductive element, a capacitive element, and an amplifier respectively coupled in parallel across a first terminal and a second terminal, and utilizing the amplifier to amplify the resonance generated by the inductance element and the capacitive element, and issuing an output from the first terminal and the second terminal,
    wherein the capacitive element includes a first capacitive element, and a second capacitive element parallel to the first capacitive element,
    wherein a resistance element is coupled in series with the first capacitive element between the first terminal and the second terminal, wherein the resistance element contains a first resistance section with one end coupled to the first terminal and the other end coupled to one end of the first capacitive element, and a second resistance section with one end coupled to the second terminal and the other end coupled to the other end of the first capacitive element, wherein the second capacitive element is coupled to the first terminal and the second terminal without any intervening resistive element.

2. An oscillator comprising:

an inductive element, a capacitive element, and an amplifier respectively coupled in parallel across a first terminal and a second terminal, and utilizing the amplifier to amplify the resonance generated by the inductance element and the capacitive element, and issuing an output from the first terminal and the second terminal, wherein the capacitive element includes a first capacitive element, and a second capacitive element parallel to the first capacitive element, wherein a resistance element is coupled in series with the first capacitive element between the first terminal and the second terminal, wherein the resistance element contains a first resistance section with one end coupled to the first terminal and the other end coupled to one end of the first capacitive element, and a second resistance section with one end coupled to the second terminal and the other end coupled to the other end of the first capacitive element, wherein the second capacitive element is coupled to the first terminal and the second terminal without any intervening resistive element, wherein the resistance element has a larger resistance value than a parasitic resistance of the inductance element between the first terminal and the second terminal.

3. The oscillator according to claim 1, wherein the resistance values of the first resistance section and the second resistance section are mutually equivalent, and the resistance value of the resistance element is equivalent to the sum of the resistance values of the first resistance section and the second resistance section.

4. The oscillator according to claim 1, wherein the first resistance section, the second resistance section and the inductance element possess essentially the same temperature coefficient.

5. The oscillator according to claim 1, wherein the first resistance section, the second resistance section and the inductance element are made from essentially the same metal.

6. The oscillator according to claim 2, wherein the resistance value of the resistance element is set by simulation or actual measurement of the prototype component to a value where the fluctuation in the oscillation frequency of the oscillator will be minimal within the temperature range during actual usage.

7. The oscillator according to claim 1, wherein the first capacitive element is a first variable capacitive element whose capacitance value is regulated by a first bias voltage.

8. The oscillator according to claim 7, wherein the first variable capacitive element is comprised of a first Metal Oxide Semiconductor (MOS) varactor whose gate is coupled by way of the first resistance section to the first terminal, and whose source-drain is coupled to the first bias voltage; and a second MOS varactor whose gate is coupled by way of the second resistance section to the second terminal, and whose source-drain is coupled to the first bias voltage.

\* \* \* \* \*